(12) United States Patent
Lee

(10) Patent No.: US 12,316,316 B2
(45) Date of Patent: May 27, 2025

(54) INTERFACE SYSTEM AND MEMORY SYSTEM INCLUDING THE SAME

(71) Applicant: SK hynix Inc., Gyeonggi-do (KR)

(72) Inventor: Seung Ho Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/674,934

(22) Filed: May 27, 2024

(65) Prior Publication Data

US 2024/0313777 A1 Sep. 19, 2024

Related U.S. Application Data

(63) Continuation of application No. 17/862,815, filed on Jul. 12, 2022, now Pat. No. 12,040,793, which is a continuation of application No. 16/989,468, filed on Aug. 10, 2020, now Pat. No. 11,387,830, which is a continuation of application No. 16/849,810, filed on Apr. 15, 2020, now Pat. No. 11,101,799, which is a continuation-in-part of application No. 16/452,089, filed on Jun. 25, 2019, now Pat. No. 10,659,047, which is a continuation of application No.
(Continued)

(30) Foreign Application Priority Data

May 24, 2017 (KR) .......................... 10-2017-0063919

(51) Int. Cl.
*H03K 19/003* (2006.01)
*H03K 19/00* (2006.01)
*H03K 19/017* (2006.01)
*H03K 19/17788* (2020.01)

(52) U.S. Cl.
CPC ... *H03K 19/00315* (2013.01); *H03K 19/0005* (2013.01); *H03K 19/01742* (2013.01); *H03K 19/17788* (2013.01)

(58) Field of Classification Search
CPC ......... H03K 19/0005; H03K 19/00315; H03K 19/01742; H03K 19/17788
See application file for complete search history.

(56) References Cited

U.S. PATENT DOCUMENTS 9,948,283 B2 * 4/2018 Takayanagi ...... H03K 19/00315
2010/0176848 A1 * 7/2010 Du ........................ G11C 7/1057
327/108

(Continued)

*Primary Examiner* — Kurtis R Bahr
(74) *Attorney, Agent, or Firm* — IP & T GROUP LLP

(57) ABSTRACT

A memory system may include a memory device and a memory controller. The memory device may be configured to store data. The memory controller may be configured to communicate with the memory device by an input/output driving circuit. The input/output driving circuit comprises a pull-down driver and a gate control logic. The pull-down driver may include a first transistor and a second transistor which are electrically coupled between a pad and a ground node. The gate control logic including a third transistor and a fourth transistor which are electrically coupled between the pad and a first terminal receiving a first driving voltage, the gate control logic being configured to receive a pad voltage provided from the pad and generate a feedback voltage. The source voltage level of the second transistor is controlled by a control signal generated based on a clock signal and an enable signal.

17 Claims, 21 Drawing Sheets

Related U.S. Application Data

15/858,516, filed on Dec. 29, 2017, now Pat. No. 10,348,301.

(56) References Cited

U.S. PATENT DOCUMENTS

| | | | |
|---|---|---|---|
| 2010/0271118 A1* | 10/2010 | Bhattacharya | ............................... H03K 19/018528 327/543 |
| 2014/0002146 A1* | 1/2014 | Kim | ............... H03K 19/018521 327/333 |
| 2016/0105182 A1* | 4/2016 | Kerr | ............... H03K 19/018521 326/80 |
| 2018/0109255 A1* | 4/2018 | Lee | ................ H03K 19/017509 |

* cited by examiner

INTERFACE SYSTEM AND MEMORY SYSTEM INCLUDING THE SAME

CROSS-REFERENCE TO RELATED APPLICATION

This present application is a continuation of U.S. patent application Ser. No. 17/862,815 filed on Jul. 12, 2022, which is a continuation application of U.S. patent application Ser. No. 16/989,468 filed on Aug. 10, 2020 and issued as U.S. Pat. No. 11,387,830 on Jul. 12, 2022, which is a continuation of U.S. patent application Ser. No. 16/849,810 filed on Apr. 15, 2020, and issued as U.S. Pat. No. 11,101,799 on Aug. 24, 2021, which is a continuation-in-part application of U.S. patent application Ser. No. 16/452,089 filed on Jun. 25, 2019, and issued as U.S. Pat. No. 10,659,047 on May 19, 2020, which is a continuation application of U.S. patent application Ser. No. 15/858,516 filed on Dec. 29, 2017, and issued as U.S. Pat. No. 10,348,301 on Jul. 9, 2019, and claims priority under 35 U.S.C. § 119(a) to Korean patent application number 10-2017-0063919 filed on May 24, 2017 in the Korean Intellectual Property Office, the entire disclosures of which are incorporated herein by references.

BACKGROUND

Field of Invention

Various embodiments of the present disclosure generally relate to an interface device and a memory system including the same, and more particularly, to a serial interface device including an input/output driving circuit.

U.S. Patent Application Publication No. US 2018/0342280 A1 to Lee, which is herein incorporated by reference for all that in contains, discloses an input buffer circuit comprising a high-voltage protection unit coupled to a pad and comprising a low-voltage pass unit and a high-voltage pass unit that are coupled in common to an output signal code.

Description of Related Art

In recent chips, a high-speed interface integrated processor (IP) requiring a low-supply voltage and a high-speed operation is widely used. Accordingly, CMOSFETs having a medium gate oxide for 1.8 V operation or CMOSFETs having a thin gate oxide for 0.9 V operation, rather than CMOSFETs having a thick gate oxide for 3.3 V operation, are widely used.

However, an IO circuit manufactured using CMOSFETs having a medium gate oxide for 1.8 V operation or a thin gate oxide for 0.9 V operation may not work properly when a voltage of 3.3 V is applied. Hence, an input/output (IO) circuit for a semiconductor device may still need to support application circuits that require a 3.3 V interface voltage.

SUMMARY

An aspect of the present disclosure is directed to an interface system including a plurality of interface devices communicating each other. Each of the interface devices comprises at least one input/output driving circuit may include a pull-down driver connected between a pad and a ground node, and a gate control logic connected between a pad voltage terminal and a first supply voltage terminal. The pull-down driver includes a first NMOS transistor connected to the pad, a second NMOS transistor connected to the first NMOS transistor, and a third NMOS transistor connected between the second NMOS transistor and the ground node. The gate control logic includes a first PMOS transistor connected to the pad voltage terminal and controlled by a first supply voltage provided from the pad voltage terminal, a second PMOS transistor connected to the first PMOS transistor, and a third PMOS transistor connected between the second PMOS transistor and the first supply voltage terminal. The second PMOS transistor is enabled based on a pad voltage provided from the pad voltage terminal, and the first NMOS transistor is enabled based on a feedback voltage provided to bulk regions of the first to third PMOS transistors.

An aspect of the present disclosure is directed to an interface system between a memory device and a memory controller. The interface system comprises at least one input/output driving circuit. The input/output driving circuit comprises a pull-down driver, and a gate control logic. The pull-down driver includes a first transistor and a second transistor which are electrically coupled between a pad and a ground node. The gate control logic includes a third transistor and a fourth transistor which are electrically coupled between the pad and a first supply voltage terminal, the gate control logic configured to receive a pad voltage provided from the pad and generate a feedback voltage. A source voltage level of the second transistor is controlled by a control signal generated based on a clock signal and an enable signal.

An aspect of the of the present disclosure is directed to a memory system may include a memory device and a memory controller. The memory device may be configured to store data. The memory controller may be configured to communicate with the memory device by an input/output driving circuit. The input/output driving circuit comprises a pull-down driver and a gate control logic. The pull-down driver may include a first transistor and a second transistor which are electrically coupled between a pad and a ground node. The gate control logic including a third transistor and a fourth transistor which are electrically coupled between the pad and a first terminal receiving a first driving voltage, the gate control logic being configured to receive a pad voltage provided from the pad and generate a feedback voltage. The source voltage level of the second transistor is controlled by a control signal generated based on a clock signal and an enable signal.

These and other features and advantages of the present invention will become apparent to those skilled in the art to which the present invention pertains from the following detailed description with reference to the accompanying drawings.

DETAILED DESCRIPTION

Figure 1:
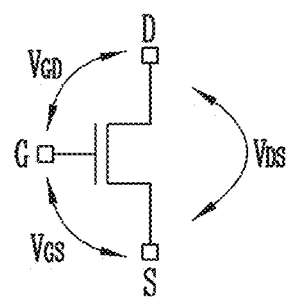
FIG. 1 is a diagram explaining an operating condition of a medium gate oxide device.

Embodiments of the present disclosure are described with reference to the accompanying drawings in order to describe the present disclosure in detail so that those having ordinary knowledge in the technical field to which the present disclosure pertains can easily practice the present disclosure. It should be noted that the same reference numerals are used to designate the same or similar elements throughout the drawings. In the following description of the present disclosure, detailed descriptions of known functions and configurations which are deemed to make the gist of the present disclosure obscure will be omitted.

FIG. 1 is a diagram explaining the operating condition of a medium gate oxide device.

In order for a medium gate oxide device 100 to stably operate, a gate-source voltage $V_{GS}$, a gate-drain voltage $V_{GD}$, and a drain-source voltage $V_{DS}$ of the medium gate oxide device 100 should satisfy certain reliability conditions. For example, if the medium gate oxide device 100 is a device designed for 1.8 V operation, when the gate-source voltage $V_{GS}$, the gate-drain voltage $V_{GD}$, and the drain-source voltage $V_{DS}$ are less than 110% of 1.8 V, the reliability of the device is guaranteed. The reliability conditions for such a device are summarized below in the following Table 1.

TABLE 1

| Voltage difference | Reliability condition |
|---|---|
| $V_{GD}$ | $V_{GD} \leq 1.98$ V |
| $V_{GS}$ | $V_{GS} \leq 1.98$ V |
| $V_{DS}$ | $V_{DS} \leq 1.98$ V |

Figure 2:
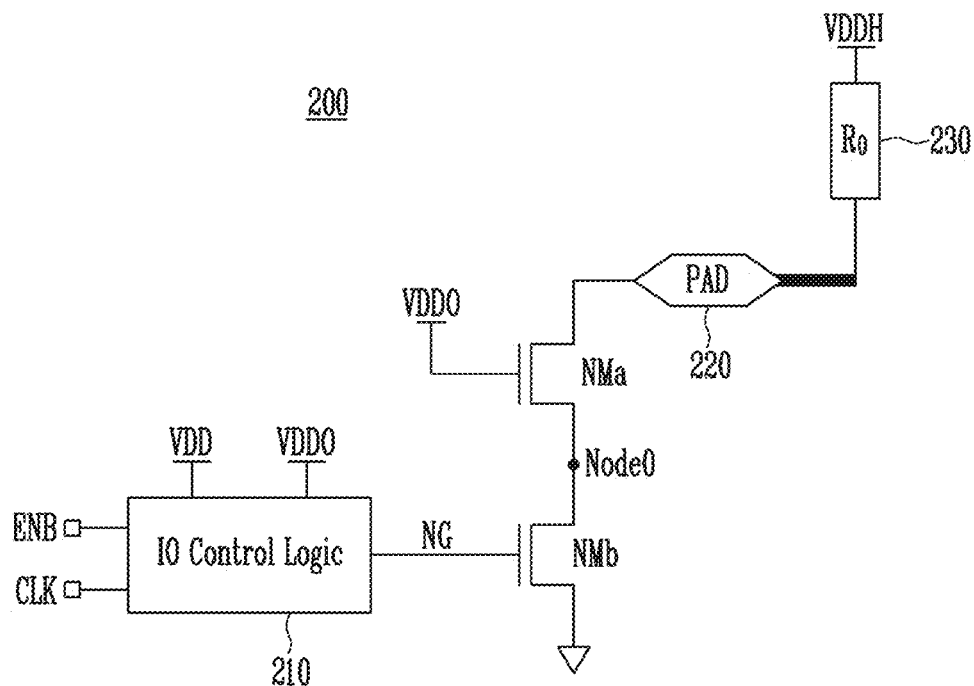
FIG. 2 is a circuit diagram illustrating an example of a conventional output driving circuit.
Figure 3:
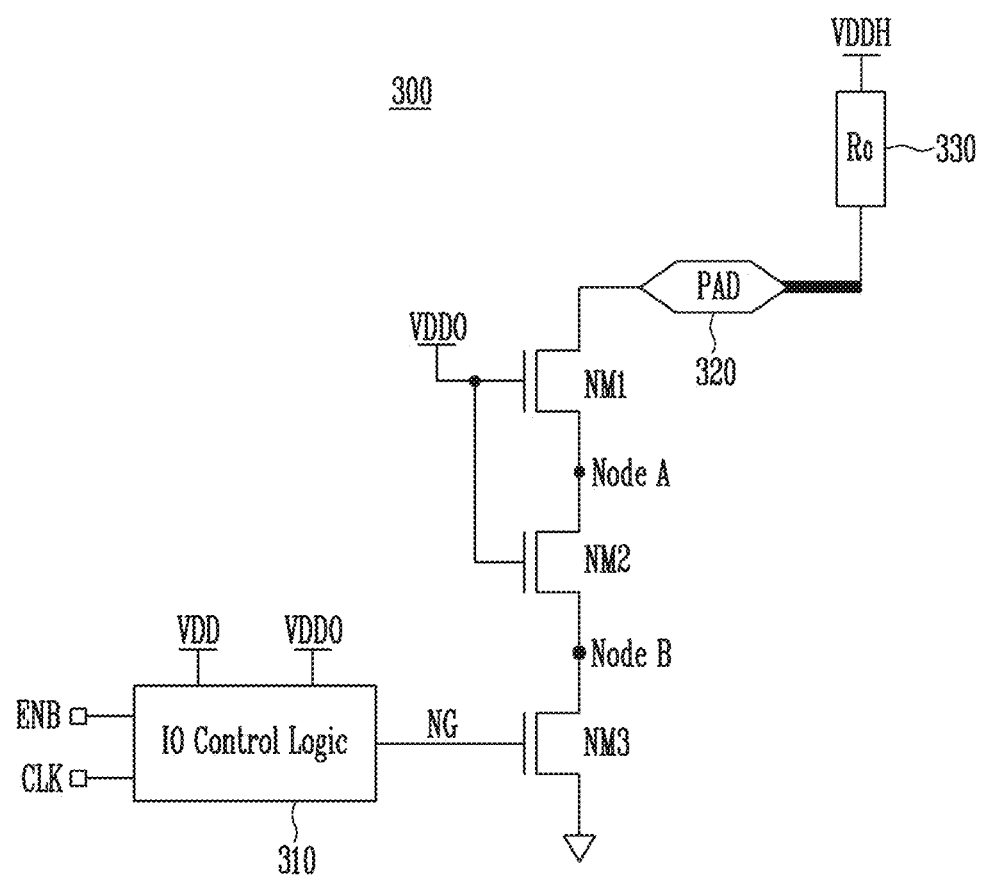
FIG. 3 is a circuit diagram illustrating another example of a conventional output driving circuit.

In order to satisfy these conditions, a conventional output driving circuit illustrated in FIG. 2 or 3 may be employed.

FIG. 2 is a circuit diagram illustrating an exemplary conventional output driving circuit.

Referring to FIG. 2, an output driving circuit 200 may include an input/output (IO) control logic 210, and a first transistor NMa and a second transistor NMb that are coupled in series to each other. The first transistor NMa is coupled between a pad 220 and a node Node0, and the second transistor NMb is coupled between the node Node0 and ground. A first supply voltage VDDO is applied to the gate electrode of the first transistor NMa, and a gate control signal NG outputted from the IO control logic 210 is applied to the gate electrode of the second transistor NMb. Further, the IO control logic 210 is operated based on the first supply voltage VDDO and a second supply voltage VDD, and is configured to receive an enable signal ENB and a clock signal CLK and output the gate control signal NG. The pad 220 is coupled to an external high voltage VDDH through an external resistor $R_O$ 230.

Figure 4A:
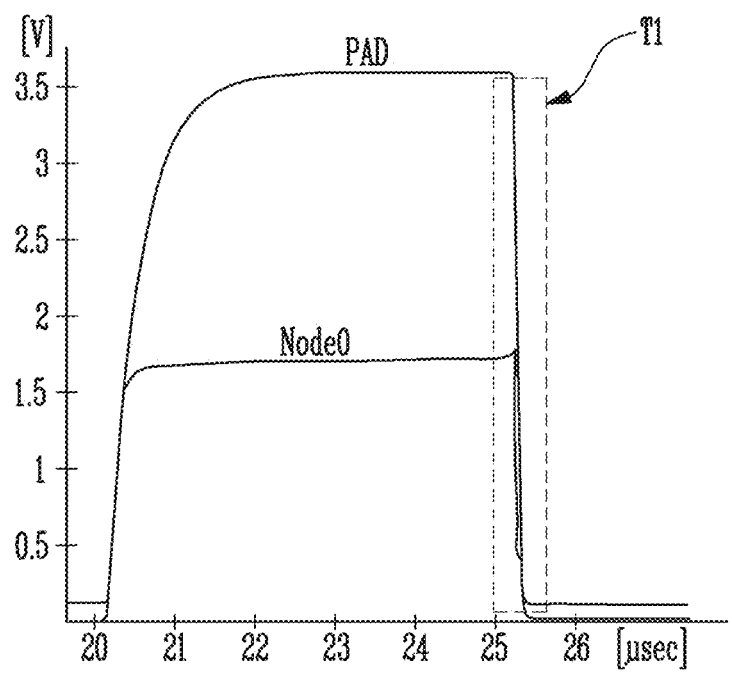
FIG. 4A is an operation waveform diagram of the output driving circuit shown in FIG. 2.
Figure 4B:
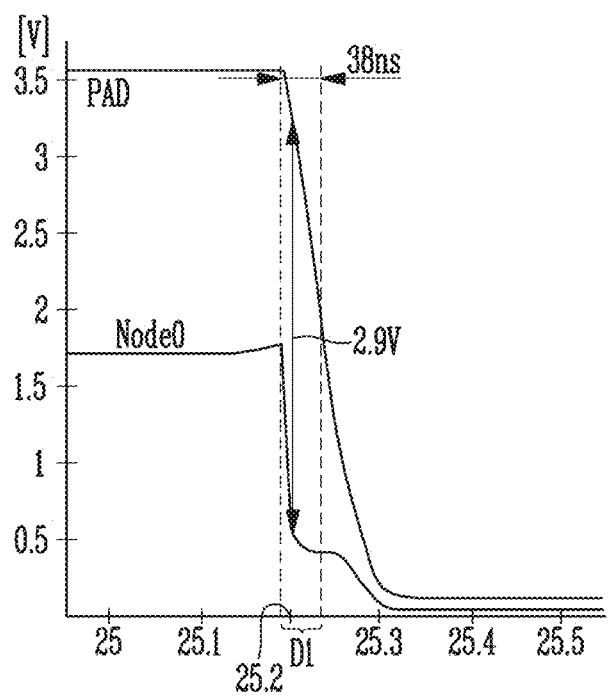
FIG. 4B is an enlarged waveform diagram illustrating a T1 period shown in FIG. 4A.

The operation waveform diagram of the output driving circuit 200 illustrated in FIG. 2 is illustrated in FIGS. 4A and 4B. The operation of the output driving circuit 200 illustrated in FIG. 2 will be described in detail later with reference to FIGS. 4A and 4B.

FIG. 3 is a circuit diagram illustrating another exemplary conventional output driving circuit.

Referring to FIG. 3, an output driving circuit 300 includes an input/output (IO) control logic 310, and a first transistor NM1, a second transistor NM2, and a third transistor NM3 that are coupled in series to each other. The first transistor NM1 is coupled between a pad 320 and a node A, the second transistor NM2 is coupled between the node A and a node B, and the third transistor NM3 is coupled between the node B and ground. A first supply voltage VDDO is applied to the gate electrodes of the first transistor NM1 and the second transistor NM2, and a gate control signal NG outputted from the IO control logic 310 is applied to the gate electrode of the third transistor NM3. On the other hand, the IO control logic 310 is operated based on the first supply voltage VDDO and a second supply voltage VDD, and is configured to receive an enable signal ENB and a clock signal CLK and then output the gate control signal NG. The pad 320 is coupled to an external high voltage VDDH through an external resistor $R_O$ 330.

Figure 5A:
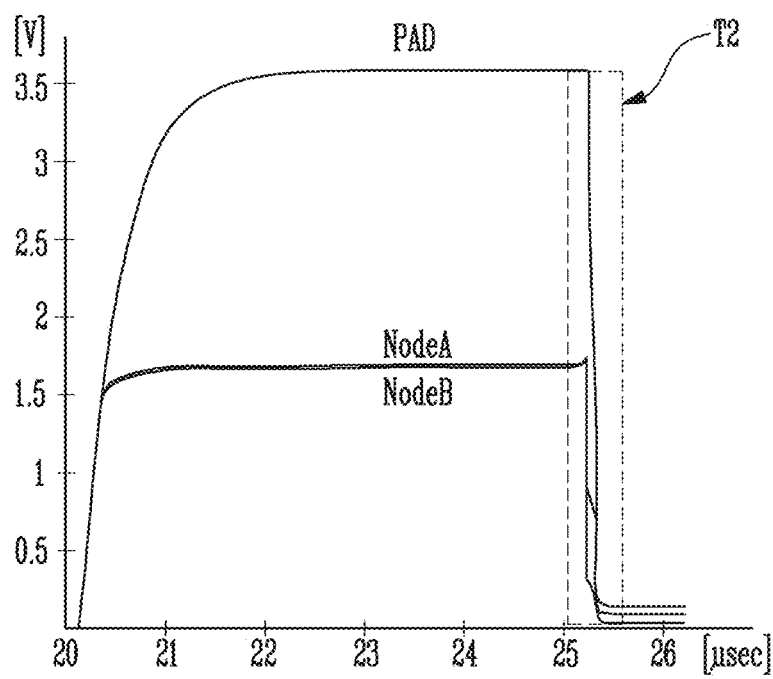
FIG. 5A is an operation waveform diagram of the output driving circuit shown in FIG. 3.
Figure 5B:
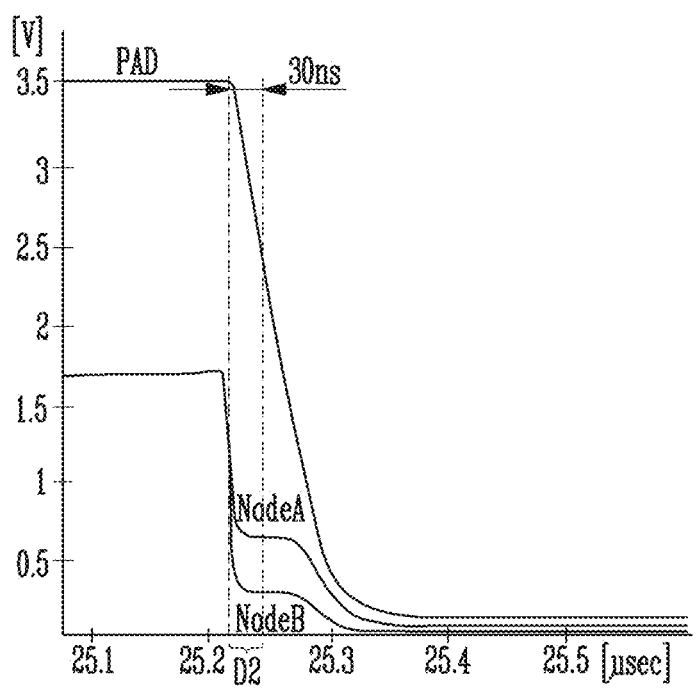
FIG. 5B is an enlarged waveform diagram illustrating a T2 period shown in FIG. 5A.

The operation waveform diagram of the output driving circuit 300 is illustrated in FIGS. 5A and 5B. The operation of the output driving circuit 300 illustrated in FIG. 3 will be described in detail later with reference to FIGS. 5A and 5B.

The conventional output driving circuits 200 and 300 illustrated in FIGS. 2 and 3 have guaranteed the reliability of devices even if a gate-source voltage $V_{GS}$, a gate-drain voltage $V_{GD}$, and a drain-source voltage $V_{DS}$ are present in a period in which reliability is deteriorated to some degree because the thickness of an oxide layer is large when interfacing signals having a voltage of 3.3 V or 5 V using a thick gate oxide device (2.5 V or 3.3 V device). However, when 3.3 V interfacing is driven using a medium gate oxide device (1.8 V device) in a current 32 or less nanometer (nm) process, it becomes difficult to satisfy reliability conditions due to the decreased thickness of the oxide layer of the device.

FIG. 4A is an operation waveform diagram of the output driving circuit of FIG. 2. FIG. 4B is an enlarged waveform diagram illustrating a T1 period of FIG. 4A.

Referring to FIG. 4A, the voltage PAD of the pad 220 and the voltage Node0 of the node Node0 depending on the pad voltage PAD are illustrated. On the whole, a difference between the voltage PAD of the pad 220 and the voltage Node0 of the node Node0 is maintained at about 2 V or less. Therefore, the condition of the drain-source voltage $V_{DS}$ of the first transistor NMa is satisfied. However, as the voltage PAD of the pad 220 drops rapidly, the voltage Node0 of the node Node0 also drops. In this case, there may occur a situation in which the reliability condition of the drain-source voltage $V_{DS}$ is not satisfied.

Referring to FIG. 4B, a waveform diagram of a T1 period indicated by a dotted line in FIG. 4A is enlarged and illustrated. As illustrated in FIG. 4B, during a D1 period (about 38 ns) of the T1 period, in which the voltage PAD of the pad 220 and the voltage Node0 of the node Node0 drop, the difference between the voltages PAD of the pad 220 and the node Node0 may temporarily be 2.9 V, which indicates a situation in which the reliability condition of the drain-source voltage $V_{DS}$ of a 1.8 V device is not satisfied.

FIG. 5A is an enlarged waveform diagram of the output driving circuit of FIG. 3. FIG. 5B is an enlarged waveform diagram of a T2 period of FIG. 5A.

Referring to FIG. 5A, the voltage PAD of a pad 320 and the voltages NodeA and NodeB of a node A and a node B depending on the pad voltage PAD are illustrated. On the whole, a difference between the voltages PAD and NodeA of the pad 320 and the node A or a difference between the voltages PAD and NodeB of the pad 320 and the node B is maintained at about 2 V or less. Therefore, the drain-source voltage $V_{DS}$ conditions of the first transistor NM1 and the second transistor NM2 are satisfied. However, as the voltage PAD of the pad 320 drops rapidly, there may occur a situation in which the reliability conditions of the drain-source voltage $V_{DS}$ of the first transistor NM1 and the second transistor NM2 are not satisfied. In addition, when the second transistor NM2 and the third transistor NM3 are turned on, a current path is formed in a direction from the node A to ground, so that a voltage of the node A may drop rapidly. Under this situation, when a relatively high voltage is applied to the pad 320, there may occur a situation in which the reliability conditions of the drain-source voltage $V_{DS}$ of the first transistor NM1 is not satisfied.

Referring to FIG. 5B, a waveform diagram of the T2 period indicated by a dotted line in FIG. 5A is enlarged and illustrated. As illustrated in FIG. 5B, during a D2 period (about 30 ns) of the T2 period, in which the voltage PAD of the pad 320 and the voltage NodeA of the node A drop, a difference between the voltage PAD of the pad 320 and the voltage NodeA of the node A may temporarily be 2.8 V, which indicates that the reliability condition of the drain-source voltage $V_{DS}$ of the 1.8V device is not satisfied.

Therefore, a new output driving circuit having improved reliability is required.

Figure 6:
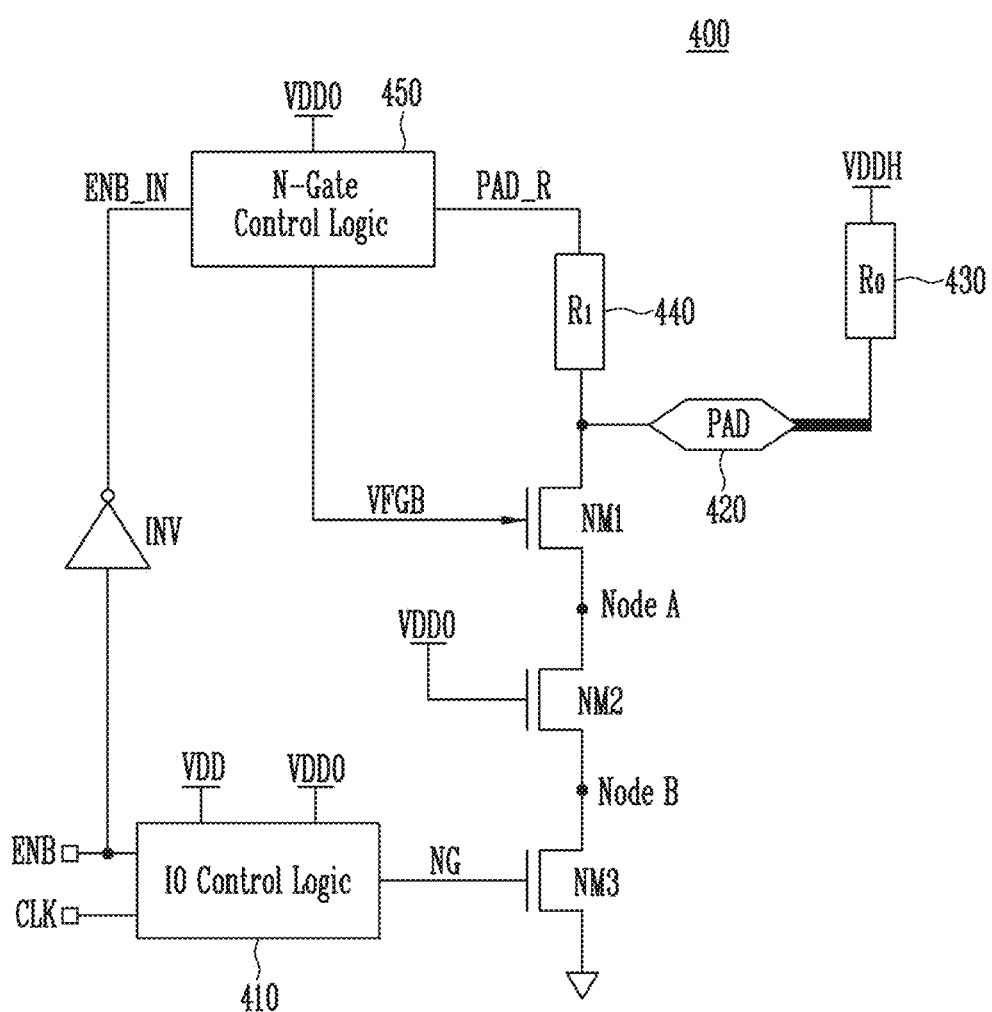
FIG. 6 is a circuit diagram illustrating an output driving circuit according to an embodiment of the present disclosure.

FIG. 6 is a circuit diagram illustrating an output driving circuit according to an embodiment of the present disclosure.

Referring to FIG. 6, an output driving circuit 400 according to an embodiment of the present disclosure may include first, second, and third transistors NM1, NM2, and NM3, which are sequentially coupled in series between a pad 420 and a ground node, an input/output (IO) control logic 410, a gate control logic 450, and an inverter INV. The IO control logic 410 may receive a clock signal CLK and an enable signal ENB, and may transfer a first control signal NG to the third transistor NM3. The gate control logic 450 receives a voltage PAD_R of an internal resistor $R_1$ 440. Further, the gate control logic 450 outputs a feedback voltage VFGB to the gate electrode of the first transistor NM1. The inverter INV inverts the enable signal ENB, and transfers an inverted enable signal ENB_IN to the gate control logic 450. The pad 420 is coupled to an external high voltage VDDH through an external resistor $R_0$ 430. The output driving circuit 400 may further include the internal resistor $R_1$ 440 coupled between the pad 420 and the gate control logic 450. In an example embodiment, the internal resistor $R_1$ 440 is may be used as an Electrostatic Discharge (ESD) protection resistor.

The first, second, and third transistors NM1, NM2, and NM3 of the output driving circuit 400 may be medium gate oxide devices of a device operating at 1.8 V. For the improvement of reliability, the transistors NM1, NM2, and NM3 are implemented in a three-stage structure, as illustrated in the drawing. Further, the first, second, and third transistors NM1, NM2, and NM3 of the output driving circuit 400 each have an open-drain output structure, wherein the gate electrode of the first transistor NM1 receives the feedback voltage VFGB, and the voltage level of the feedback voltage VFGB is changed depending on the level of the open-drain output. Here, the first supply voltage VDDO may be 1.8 V, and the external high voltage VDDH may be 3.3 V. When the output is activated, the enable signal ENB is in a high state. If the clock signal CLK is in a high state, the pad 420 makes a transition to a high state in response to the external high voltage VDDH coupled through the external resistor $R_0$ 430. If the clock signal CLK is in a low state, an NMOS driver of the open-drain output structure is turned on and is operated such that the pad 420 is in a low state. Here, the detailed configuration of the gate control logic 450 will be described in detail below with reference to FIGS. 7 and 8.

Figure 7:
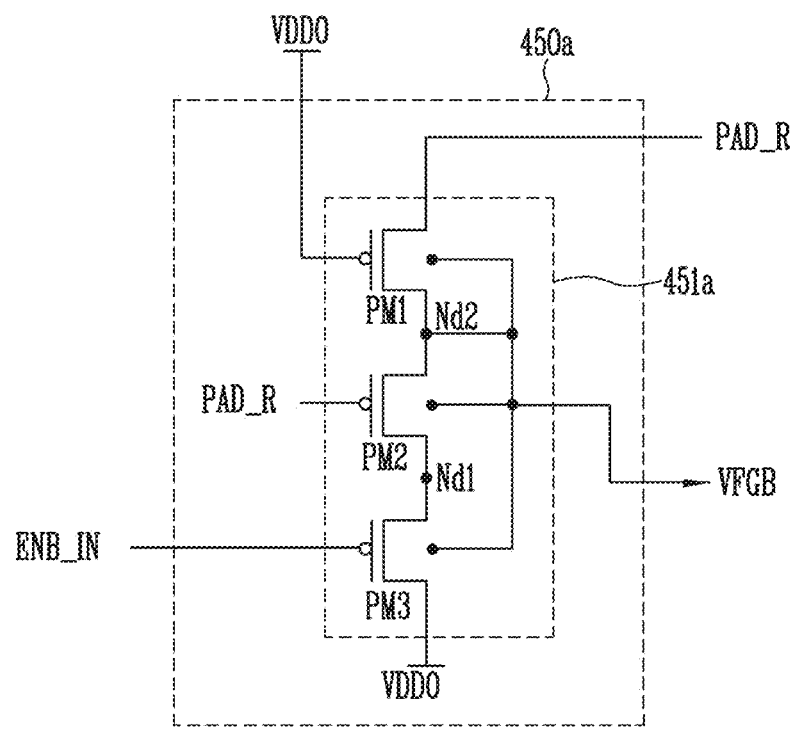
FIG. 7 is a circuit diagram illustrating an embodiment of a gate control logic shown in FIG. 6.

FIG. 7 is a circuit diagram illustrating an embodiment of the gate control logic 450 of FIG. 6.

Referring to FIG. 7, an exemplary gate control logic 450a includes first, second, and third PMOS transistors PM1, PM2, and PM3 that are sequentially coupled in series between the pad voltage PAD_R and the first supply voltage VDDO. The structure of the first, second, and third PMOS transistors PM1, PM2 and PM3 may configure a feedback transistor unit 451a. The drain electrode of the first PMOS transistor PM1 and the source electrode of the second PMOS transistor PM2 are coupled to a node Nd2. Further, the drain electrode of the second PMOS transistor PM2 and the source electrode of the third PMOS transistor PM3 are coupled to a node Nd1. The first supply voltage VDDO is applied to the gate electrode of the first PMOS transistor PM1, the pad voltage PAD_R is applied to the gate electrode of the second PMOS transistor PM2, and the inverted enable signal ENB_IN is applied to the gate electrode of the third PMOS transistor PM3. Further, bulk regions of the first, second, and third PMOS transistors PM1, PM2, and PM3 are coupled to the feedback voltage VFGB.

When the clock signal CLK is in a low state, the pad voltage PAD_R makes a transition to a low state so that the second PMOS transistor PM2 is turned on, and thus the first supply voltage VDDO (i.e., 1.8 V) is outputted as the feedback voltage VFGB. Accordingly, the first transistor NM1 remains turned on. Here, since the gate voltage of the first PMOS transistor PM1 is the first supply voltage VDDO, and the pad 420 is in a low state, the first PMOS transistor PM1 is turned off. Consequently, a current path in a direction from the first supply voltage VDDO coupled to the third PMOS transistor PM3 to the pad voltage PAD_R is blocked.

Thereafter, when the clock signal CLK makes a transition to a high state, at the time at which the voltage of the pad 420 is changed from 0 V to the external high voltage VDDH (i.e., 3.3 V), the first PMOS transistor PM1 is turned on and thus the feedback voltage VFGB follows the voltage level of the pad 420 at a moment when a level of the pad voltage PAD_R is greater than levels of the first supply voltage VDDO and the threshold voltage Vth_PM1 of the first PMOS transistor. Here, the feedback voltage VFGB may be increased from the first supply voltage VDDO to the external high voltage VDDH. Simultaneously with the increase in the feedback voltage VFGB, the second PMOS transistor PM2 becomes turned off as the gate voltage of the second PMOS transistor PM2 (i.e., the pad voltage PAD_R) becomes identical to the feedback voltage VFGB. Accordingly, a current path from the output terminal of the feedback voltage VFGB to the first supply voltage VDDO coupled to the third PMOS transistor PM3 is blocked so that power consumption may be decreased and thus the drop of the feedback voltage VFGB may be prevented. In addition, the voltage of the node Nd1 is 1.8 V. Therefore, even if the feedback voltage VFGB increases to 3.3 V, the voltage difference among the gate-source voltage $V_{GS}$, the gate-drain voltage $V_{GD}$, and the drain-source voltage $V_{DS}$ of the second PMOS transistor PM2 may be maintained at 1.98 V or less and thus the reliability condition of the second PMOS transistor PM2 may be satisfied. Meanwhile, because the gate control logic of FIG. 7 uses the voltage of PAD_R, a path coupled to ground may be disconnected or weakly connected to block electrical flow through the path. Accordingly, current consumption may be reduced.

That is, the output driving circuit according to an embodiment of the present disclosure may improve the reliability of the device because the difference between the voltages of the pad 420 and the node A may be maintained at 1.98 V or less even if the clock signal CLK makes a transition from a low state to a high state, that is, even if the voltage of the pad 420 makes a transition from the external high voltage VDDH to 0 V, in the characteristics of the open-drain output structure. In addition, since the relatively high feedback voltage VFGB is applied to the first transistor NM1, a current is rapidly supplied to the node A. Therefore, the supply of the current to the node A by the feedback voltage VFGB prevents the voltage of the node A from dropping rapidly even when the second transistor NM2 and the third transistor NM3 are turned so that a current flows from the node A to ground. Accordingly, the drain-source voltage VDS conditions of the first transistor NM1 and the second transistor NM2 may be satisfied even when a relatively high voltage is applied to the pad 420. The operation waveform diagrams of the output driving circuit 400 according to the embodiments of FIGS. 6 and 7 are illustrated in FIGS. 9A and 9B, and the operating characteristics thereof will be described in detail later with reference to FIGS. 9A and 9B.

Figure 8:
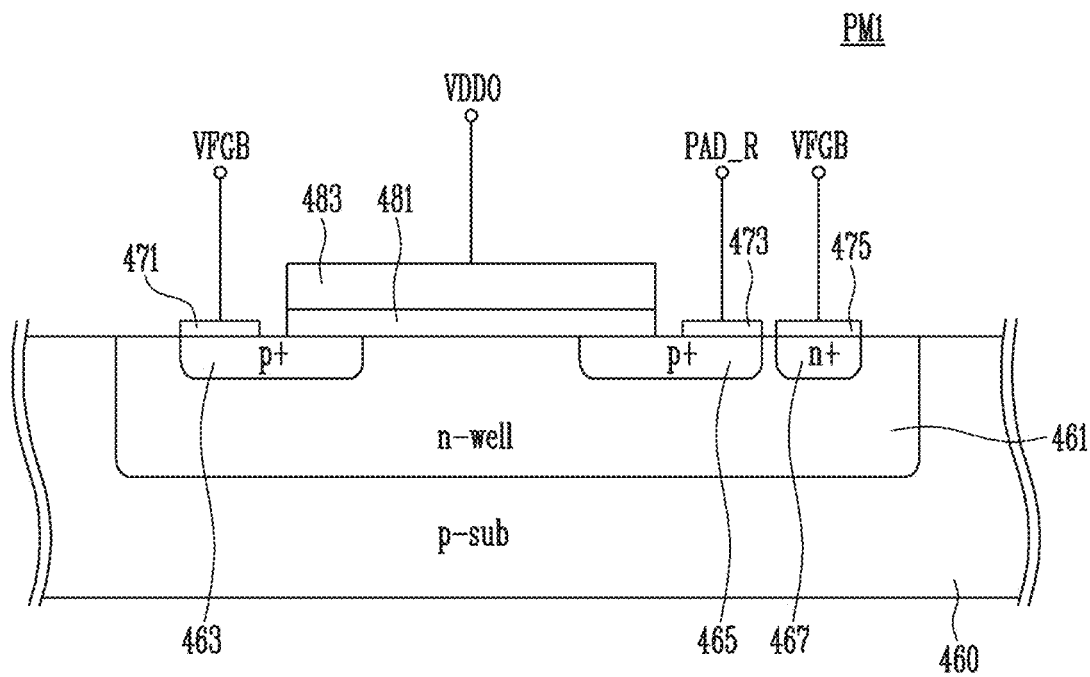
FIG. 8 is a diagram illustrating the detailed configuration of a first PMOS transistor shown in FIG. 7.

FIG. 8 is a diagram illustrating the detailed configuration of the first PMOS transistor PM1 of FIG. 7.

In FIG. 7, the bulk region of the first PMOS transistor PM1 is illustrated as being coupled to the feedback voltage VFGB. In FIG. 8, the structure of the first PMOS transistor PM1 is illustrated in detail.

Referring to FIG. 8, an N-type well (n-well) 461 is formed in a P-type substrate (p-sub) 460. The N-type well 461 may act as the bulk region of the first PMOS transistor PM1. Further, a source region 465 and a drain region 463 are formed in the N-type well 461. The source region 465 and the drain region 463 may be formed as high-concentration P+ regions. A source electrode 473 and a drain electrode 471 are formed on the source region 465 and the drain region 463, respectively. Further, an insulating layer 481 and a gate electrode 483 are formed on the N-type well 461. By means of this configuration, the PMOS transistor is implemented. A high-concentration N+ region 467 is additionally formed in the N-type well 461, and thus electrical coupling to the N-type well 461 that is a bulk region is provided. A bulk electrode 475 is formed on the N+ region 467.

Referring to the electrode coupling of the first PMOS transistor PM1, the source electrode 473 is coupled to the pad voltage PAD_R, the drain electrode 471 is coupled to the feedback voltage VFGB, and the gate electrode 483 is coupled to the first supply voltage VDDO. Further, the bulk electrode 475 is coupled to the feedback voltage VFGB, and thus the electrical coupling relation of the first PMOS transistor PM1 illustrated in FIG. 7 may be established.

Figure 9:
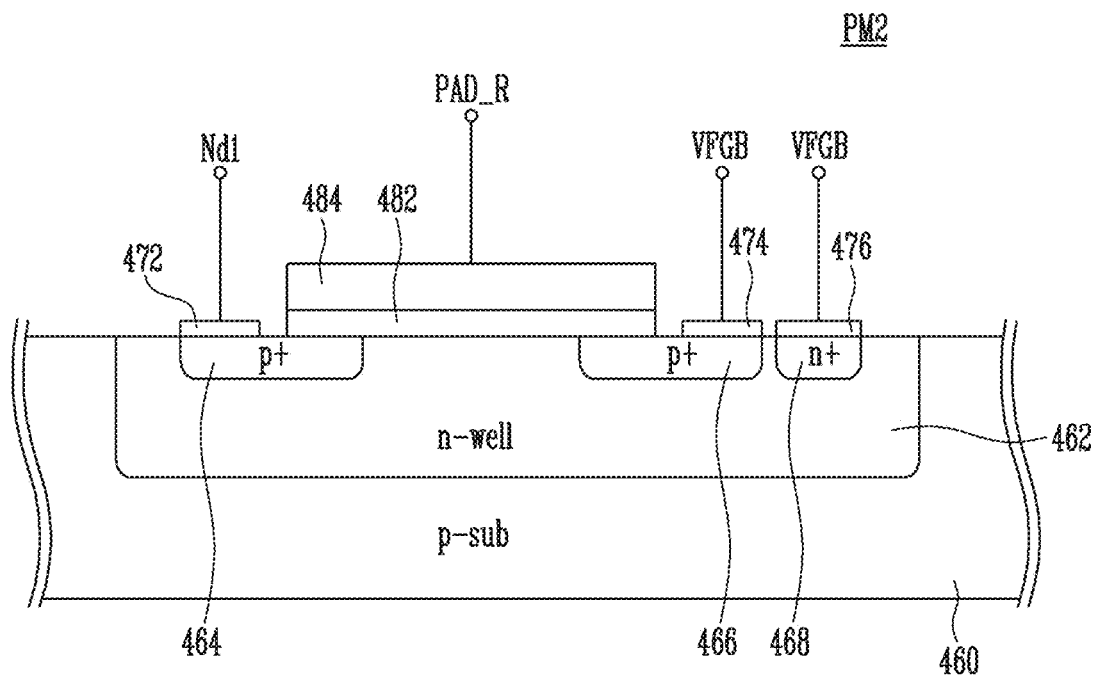
FIG. 9 is a diagram illustrating the detailed configuration of a second PMOS transistor shown in FIG. 7.

FIG. 9 is a diagram illustrating the detailed configuration of the second PMOS transistor PM2 of FIG. 7.

In FIG. 7, the bulk region of the second PMOS transistor PM2 is illustrated as being coupled to the feedback voltage VFGB. In FIG. 9, the structure of the second PMOS transistor PM2 is illustrated in detail.

Referring to FIG. 9, an N-type well (n-well) 462 is formed in a P-type substrate (p-sub) 460. The N-type well 462 may act as the bulk region of the second PMOS transistor PM2. Further, a source region 466 and a drain region 464 are formed in the N-type well 462. The source region 466 and the drain region 464 may be formed as high-concentration P+ regions. A source electrode 474 and a drain electrode 472 are formed on the source region 466 and the drain region 464, respectively. Further, an insulating layer 482 and a gate electrode 484 are formed on the N-type well 462. By means of this configuration, the PMOS transistor is implemented. Further, a high-concentration N+ region 468 is additionally formed in the N-type well 462, and electrical coupling to the N-type well 462 that is the bulk region is provided. A bulk electrode 476 is formed on the N+ region 468.

Referring to the electrode coupling of the second PMOS transistor PM2, the source electrode 474 is coupled to the feedback voltage VFGB, the drain electrode 472 is coupled to the node Nd1, and the gate electrode 484 is coupled to the pad voltage PAD_R. Further, the bulk electrode 476 is coupled to the feedback voltage VFGB, and thus the electrical coupling relation of the second PMOS transistor PM2 illustrated in FIG. 7 may be established.

Figure 10:
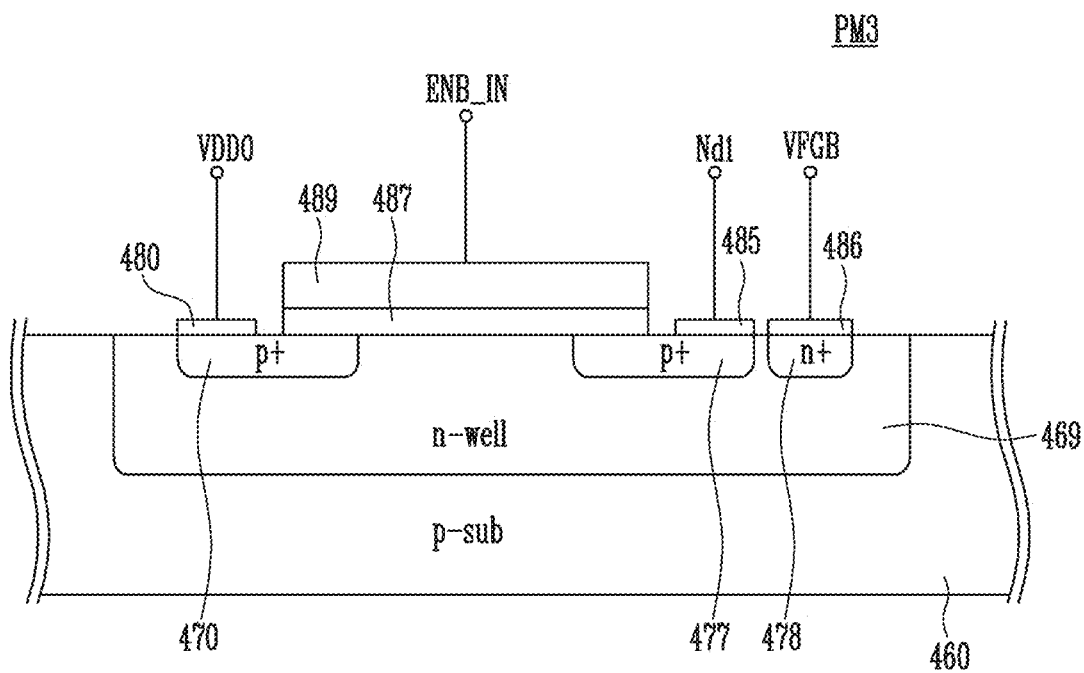
FIG. 10 is a diagram illustrating the detailed configuration of a third PMOS transistor shown in FIG. 7.

FIG. 10 is a diagram illustrating the detailed configuration of the third PMOS transistor PM3 of FIG. 7.

In FIG. 7, the bulk region of the third PMOS transistor PM3 is illustrated as being coupled to the feedback voltage VFGB. In FIG. 10, the structure of the third PMOS transistor PM3 is illustrated in detail.

Referring to FIG. 10, an N-type well (n-well) 469 is formed in a P-type substrate (p-sub) 460. The N-type well 469 may act as the bulk region of the third PMOS transistor PM3. A source region 477 and a drain region 470 are formed in the N-type well 469. The source region 477 and the drain region 470 may be formed as high-concentration P+ regions. A source electrode 485 and a drain electrode 480 may be formed on the source region 477 and the drain region 470, respectively. Further, an insulating layer 487 and a gate electrode 489 are formed on the N-type well 469. By means of this configuration, the PMOS transistor is implemented. Furthermore, a high-concentration N+ region 478 is additionally formed in the N-type well 469, and thus electrical coupling to the N-type well 469 that is the bulk region is provided. A bulk electrode 486 is formed on the N+ region 478.

Referring to the electrode coupling of the third PMOS transistor PM3, the source electrode 485 is coupled to the node Nd1, the drain electrode 480 is coupled to the first supply voltage VDDO, and the gate electrode 489 is coupled to the inverted enable signal ENB_IN. Also, the bulk electrode 486 is coupled to the feedback voltage VFGB, and thus the electrical coupling relation of the third PMOS transistor PM3 illustrated in FIG. 7 may be established.

Figure 11:
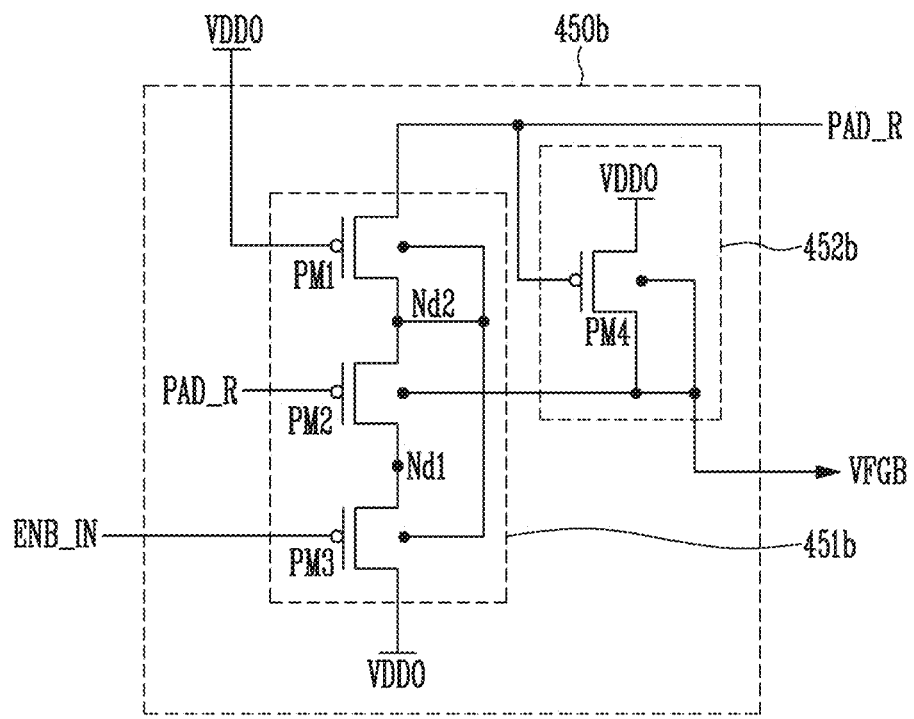
FIG. 11 is a circuit diagram illustrating another embodiment of a gate control logic shown in FIG. 6.

FIG. 11 is a circuit diagram illustrating an embodiment of the gate control logic 450 of FIG. 6.

A gate control logic 450b in FIG. 11 has a structure entirely similar to that of the gate control logic 450a of FIG. 7, and is different from the gate control logic 450a in that a fourth PMOS transistor PM4 is further included. The fourth PMOS transistor PM4 may constitute a voltage stabilization unit 452b. That is, the gate control logic 450b includes a feedback transistor unit 451b and the voltage stabilization unit 452b. An effect obtained by further including the fourth PMOS transistor PM4 will be described later with reference to FIG. 13.

Figure 12A:
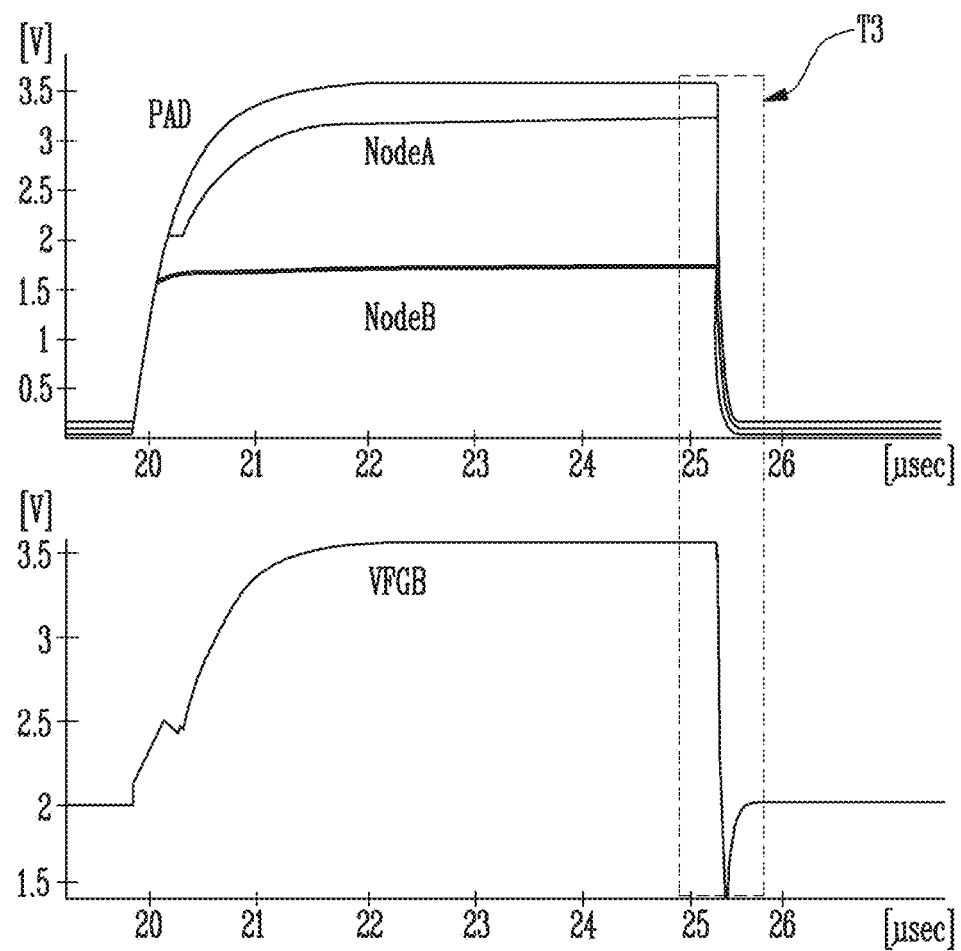
FIG. 12A is an exemplary operation waveform diagram of the output driving circuit shown in FIG. 6.
Figure 12B:
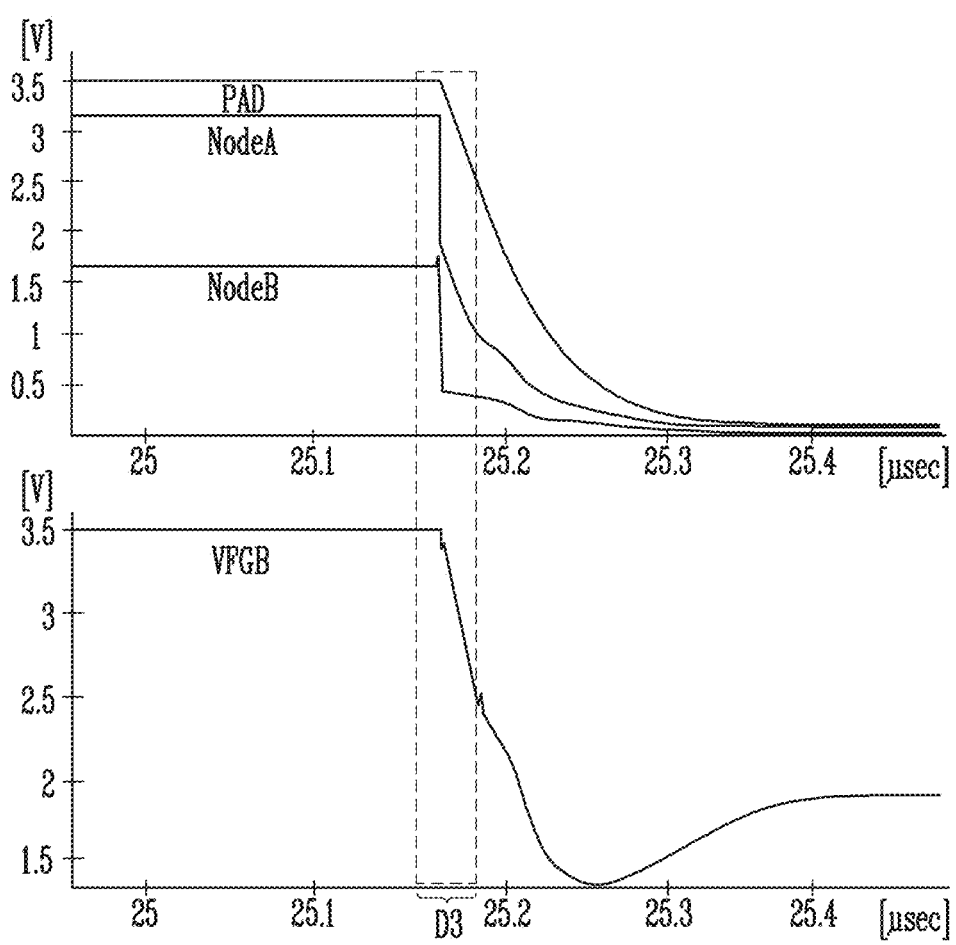
FIG. 12B is an enlarged waveform diagram illustrating a T3 period shown in FIG. 12A.

FIG. 12A is an operation waveform diagram of the output driving circuit 400 of FIG. 6. FIG. 12B is an enlarged waveform diagram illustrating a T3 period of FIG. 12A.

Referring to FIG. 12A, when the clock signal CLK makes a transition from a low state to a high state, the voltage PAD of the pad 420 is changed from the external high voltage VDDH to 0 V. Accordingly, the voltage level of the feedback voltage VFGB is changed from 3.3 V to 1.8 V. That is, after the bias of the pad 420 has been applied to the gate of the first transistor NM1, the gate bias is switched to 1.8 V. Accordingly, a difference between the voltages PAD and NodeA of the pad 420 and the node A may be minimized by gradually dropping the voltage level of the feedback voltage VFGB in a state in which the voltage NodeA of the node A is increased by "VDDH-Vth_NM1". Accordingly, the reliability condition of the first transistor NM1 is satisfied.

Figure 13:
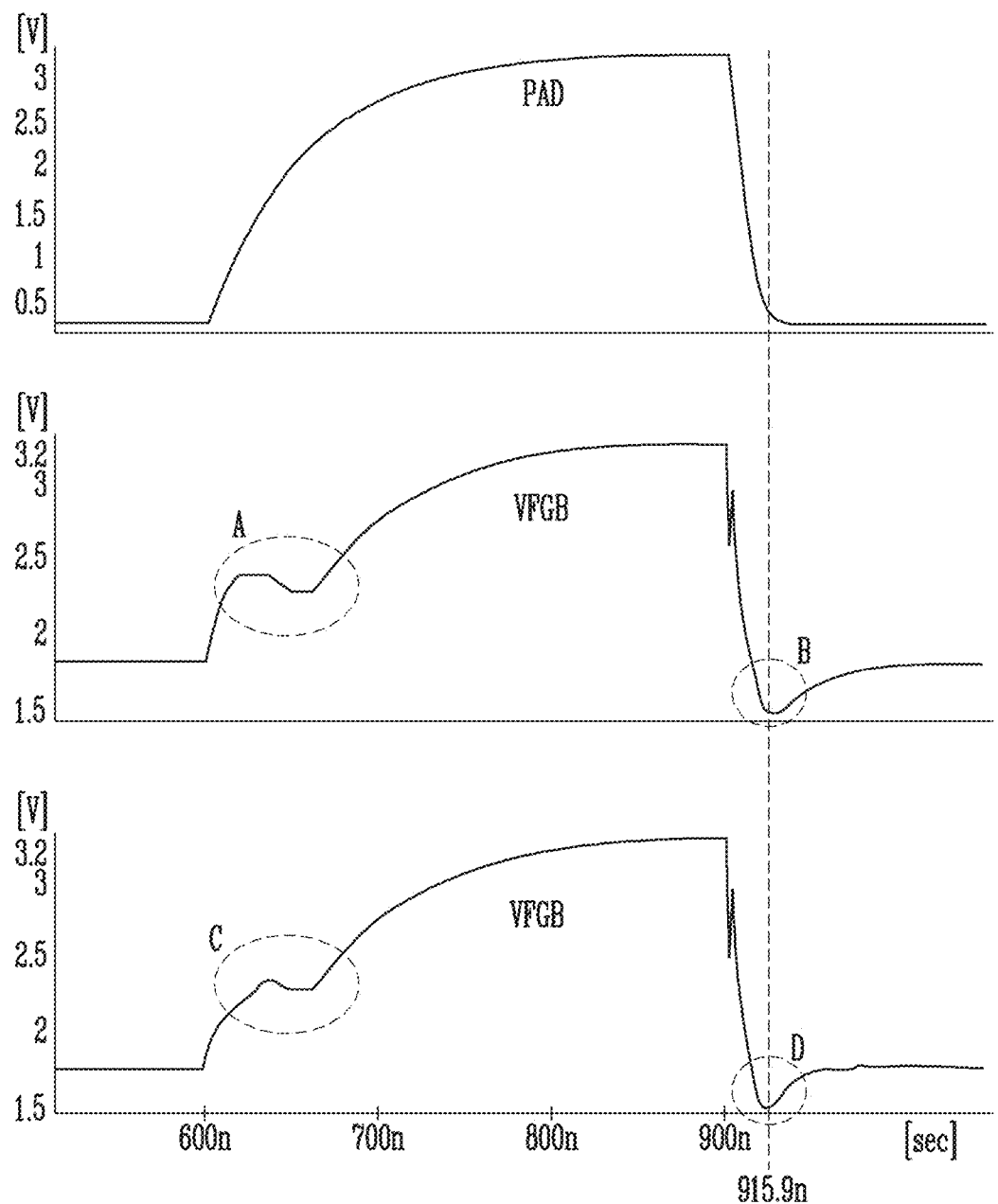
FIG. 13 is an exemplary waveform diagram explaining the effect of adding a fourth PMOS transistor illustrated in FIG. 11.

FIG. 13 is a waveform diagram explaining the effect of adding the fourth PMOS transistor PM4, that is, the voltage stabilization unit 452b illustrated in FIG. 11. In FIG. 13, a pad voltage, a feedback voltage VFGB in the absence of the fourth PMOS transistor PM4, and a feedback voltage VFGB in the presence of the fourth PMOS transistor PM4 are sequentially illustrated.

When the fourth PMOS transistor PM4 is not added, the feedback voltage VFGB is unstable in region A and region B. However, when the fourth PMOS transistor PM4 is added, it can be seen that the feedback voltage VFGB is stable in region C and region D.

Figure 14:
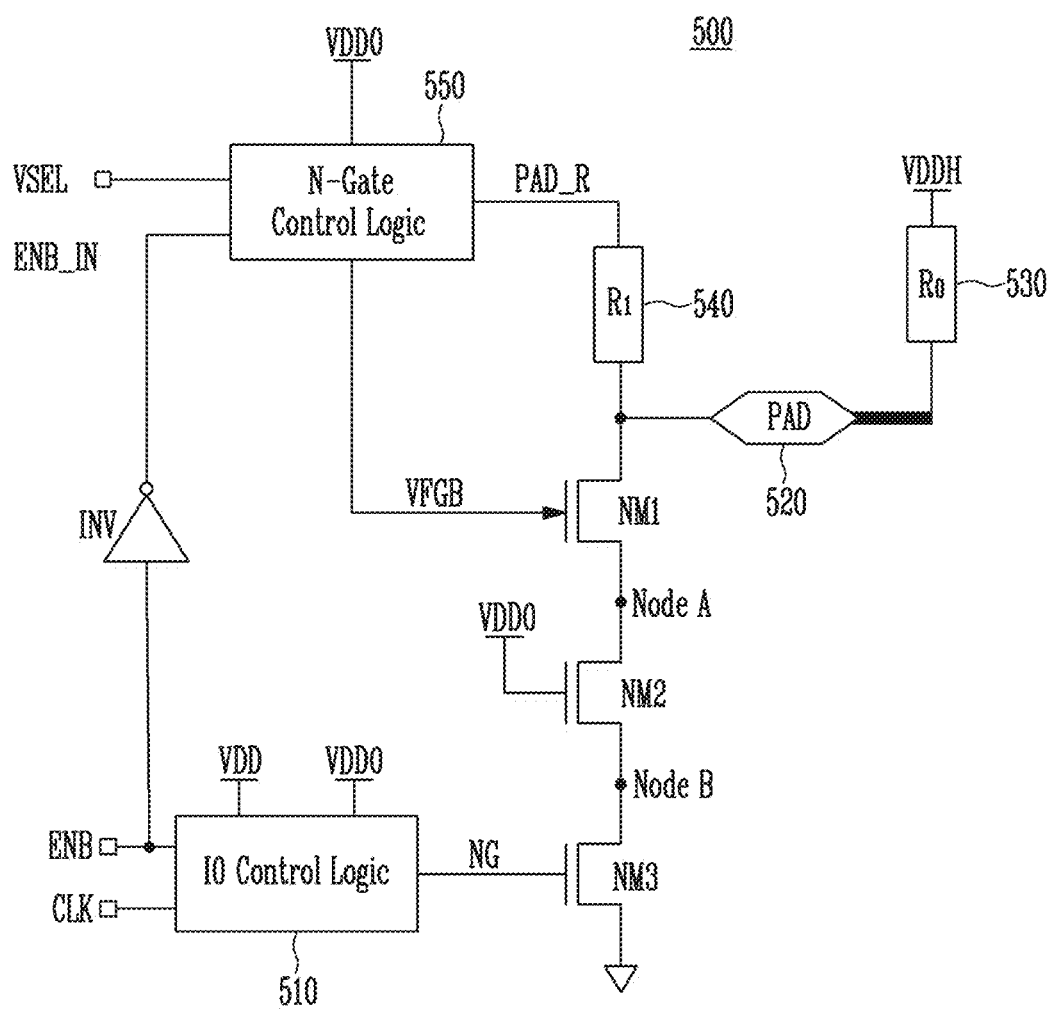
FIG. 14 is a circuit diagram illustrating an output driving circuit according to another embodiment of the present disclosure.

FIG. 14 is a circuit diagram illustrating an output driving circuit according to an embodiment of the present disclosure.

Referring to FIG. 14, an output driving circuit 500 according to an embodiment of the present disclosure may include first, second, and third transistors NM1, NM2, and NM3, which are sequentially coupled in series between a pad 520 and a ground node, an IO control logic 510, a gate control logic 550, and an inverter INV. The IO control logic 510 may receive a clock signal CLK and an enable signal ENB and may transfer a first control signal NG to the third transistor NM3. The gate control logic 550 receives a voltage PAD_R of an internal resistor $R_1$ 540. Further, the gate control logic 550 outputs a feedback voltage VFGB to the gate electrode of the first transistor NM1. The inverter INV inverts the enable signal ENB and transfers an inverted enable signal ENB_IN to the gate control logic 550. Further, the gate control logic 550 receives a second control signal VSEL. The pad 520 is coupled to an external high voltage VDDH through an external resistor $R_0$ 530. The output driving circuit 500 may further include the internal resistor $R_1$ 540 coupled between the pad 520 and the gate control logic 550. As described above, the internal resistor $R_1$ 540 may be used as an ESD protection resistor. The output driving circuit 500 of FIG. 14 is different from the output driving circuit 400 of FIG. 6 in that the gate control logic 550 additionally receives the second control signal VSEL. The detailed configuration and operation of the gate control logic 550 depending on the second control signal will be described below with reference to FIG. 15.

Figure 15:
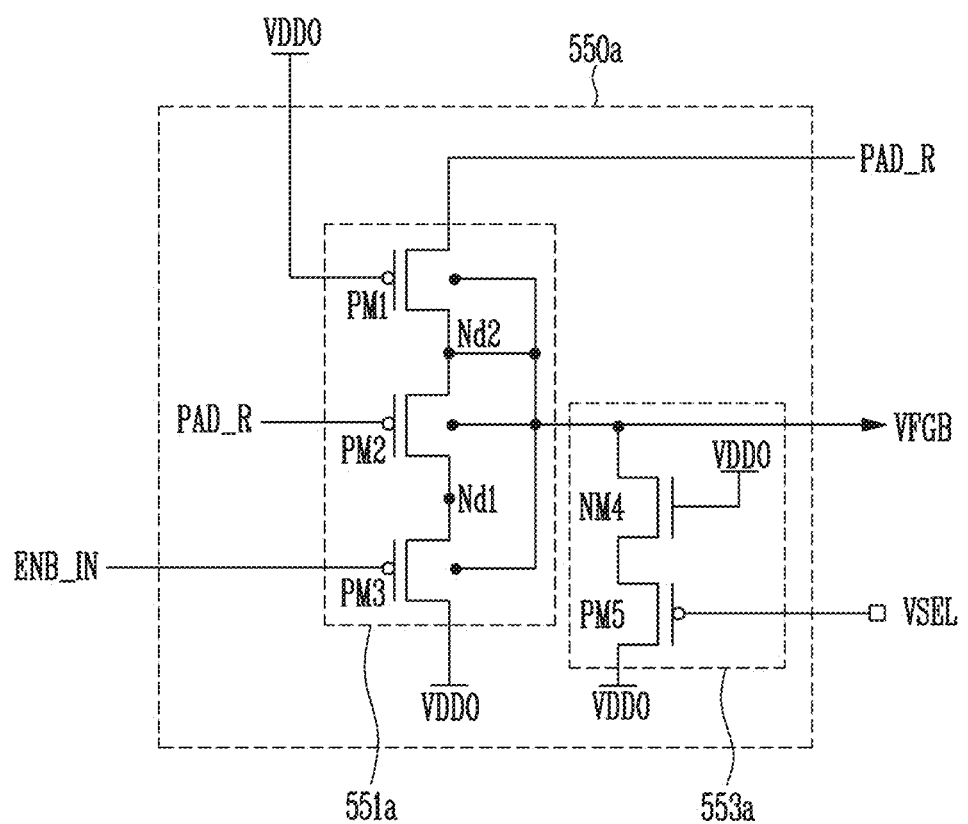
FIG. 15 is a circuit diagram illustrating an embodiment of a gate control logic shown in FIG. 14.

FIG. 15 is a circuit diagram illustrating an embodiment of the gate control logic 500 of FIG. 14.

Referring to FIG. 15, an exemplary gate control logic 550a includes first, second, and third PMOS transistors PM1, PM2, and PM3 that are sequentially coupled in series between the pad voltage PAD_R and the first supply voltage VDDO. The structure of the first, second, and third PMOS transistors PM1, PM2, and PM3 may constitute a feedback transistor unit 551a. First, the drain electrode of the first PMOS transistor PM1 and the source electrode of the second PMOS transistor PM2 are coupled to a node Nd2. Further, the drain electrode of the second PMOS transistor PM2 and the source electrode of the third PMOS transistor PM3 are coupled to a node Nd1. Furthermore, the first supply voltage VDDO is applied to the gate electrode of the first PMOS transistor PM1, the pad voltage PAD_R is applied to the gate electrode of the second PMOS transistor PM2, and the inverted enable signal ENB_IN is applied to the gate electrode of the third PMOS transistor PM3. In addition, the voltage of bulk regions of the first, second, and third PMOS transistors PM1, PM2, and PM3 is outputted as a feedback voltage VFGB.

On the other hand, the gate control logic 550a of FIG. 15 is different from the gate control logic 450a of FIG. 7 in that a fourth NMOS transistor NM4 and a fifth PMOS transistor PM5 that are sequentially coupled in series between the output terminal of the feedback voltage VFGB and the first supply voltage VDDO are further included. The fourth NMOS transistor NM4 and the fifth PMOS transistor PM5 may constitute an external voltage selection unit 553a. The first supply voltage VDDO is applied to the gate electrode of the fourth NMOS transistor NM4, and a second control signal VSEL is applied to the gate electrode of the fifth PMOS transistor PM5. Owing to the additional fourth NMOS transistor NM4, the disclosed open-drain output structure may be operated even when an external high voltage VDDH is 1.8 V. Further, when the external high voltage VDDH is 3.3 V, the reliability condition of the fourth NMOS transistor NM4 may be satisfied by causing the drain voltage of the fourth NMOS transistor NM4 to be "VDDO-Vth_NM4" (about 1.4 V in this case).

When the external high voltage VDDH is 3.3 V, the gate control logic 550a illustrated in FIG. 15 is operated in the same way as the gate control logic 450a illustrated in FIG. 7. When the external voltage VDDH is 1.8 V, the feedback voltage VFGB is maintained at a value between "VDDO-Vth_NM4" and 1.8 V (i.e., 1.4 V≤VFGB≤ 1.8 V). That is, a more flexible open-drain output structure than the external voltage selection unit 553a may be used.

Figure 16:
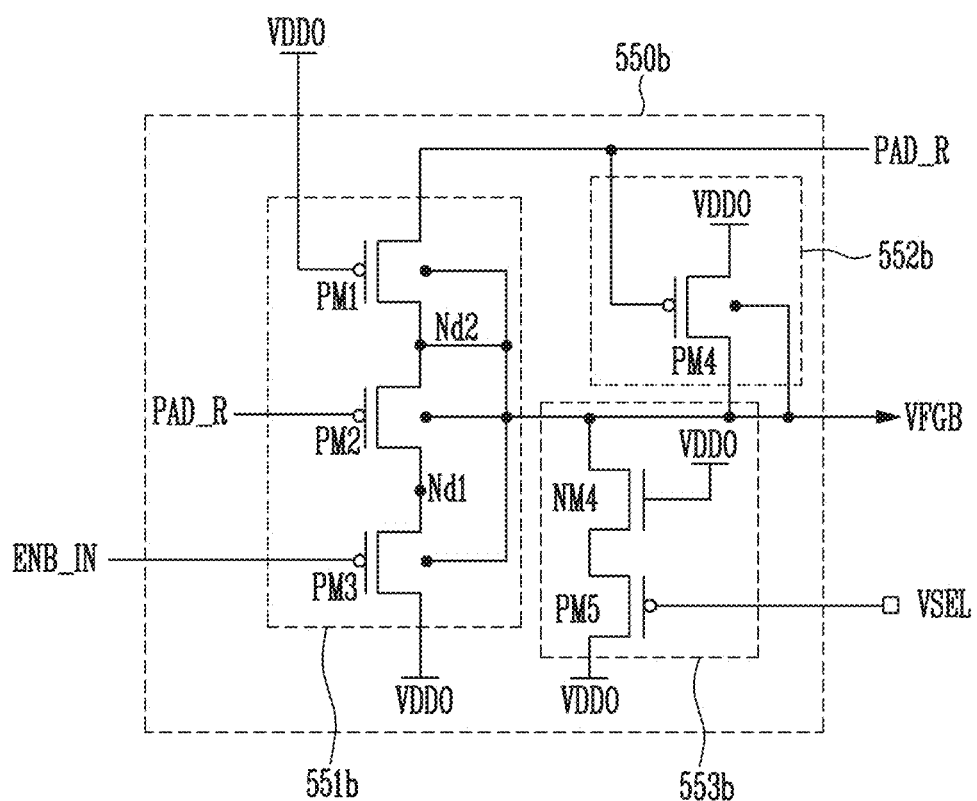
FIG. 16 is a circuit diagram illustrating another embodiment of a gate control logic shown in FIG. 14.

FIG. 16 is a circuit diagram illustrating an embodiment of the gate control logic 550 of FIG. 11.

The configuration of a gate control logic 550b illustrated in FIG. 16 is similar to the gate control logic 550a illustrate in FIG. 15, and includes a feedback transistor unit 551b and an external voltage selection unit 553b. There is a difference in that the gate control logic 550b of FIG. 16 further includes a fourth PMOS transistor PM4 such as that illustrated in FIG. 11, that is, a voltage stabilization unit 552b. As described above with reference to FIG. 13, the fourth PMOS transistor PM4 is added, and thus a more stable feedback voltage VFGB may be formed.

Figure 17:
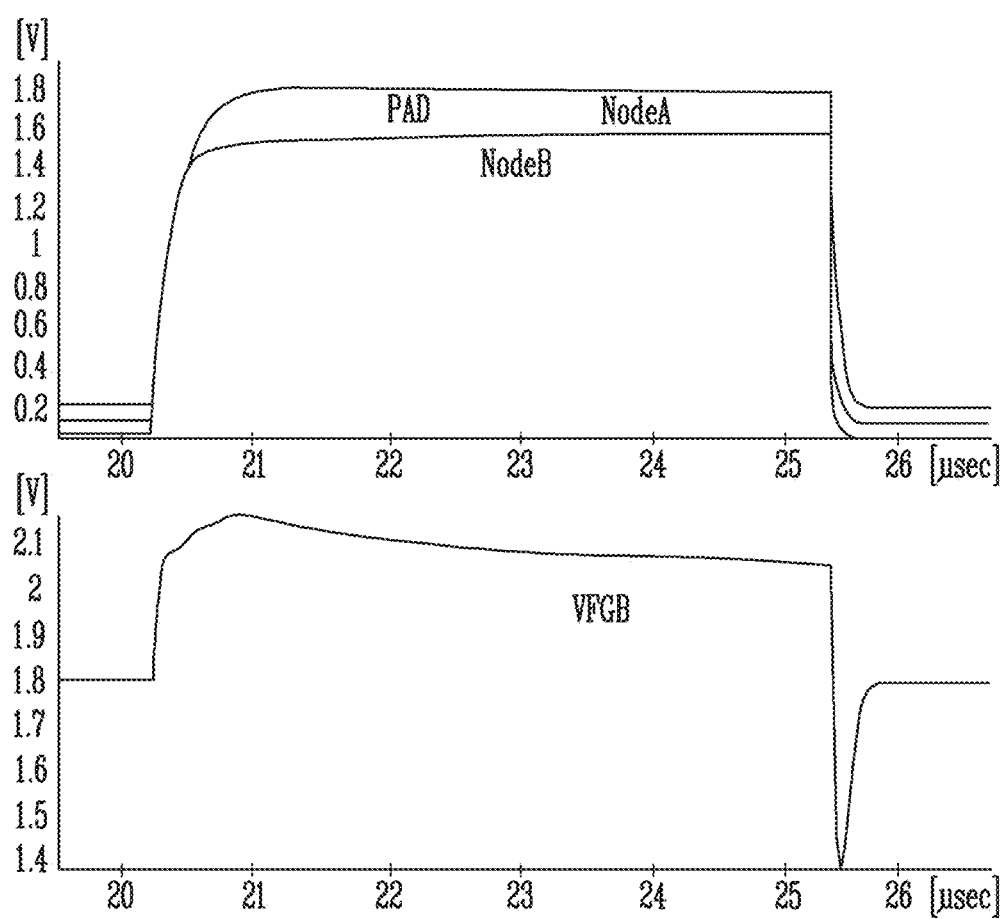
FIG. 17 is a waveform diagram illustrating the operation of the output driving circuit shown in FIG. 14 when an external high voltage is applied.

FIG. 17 is a waveform diagram illustrating the operation of the output driving circuit 500 of FIG. 14 when an external high voltage VDDH is 1.8 V. When the output driving circuit 500 is implemented, as illustrated in FIGS. 14 and 15, the reliability conditions of the corresponding device may be suitably satisfied even when the external high voltage VDDH is 1.8 V.

In accordance with the present technology, an output driving circuit having improved reliability may be provided.

Figure 18:
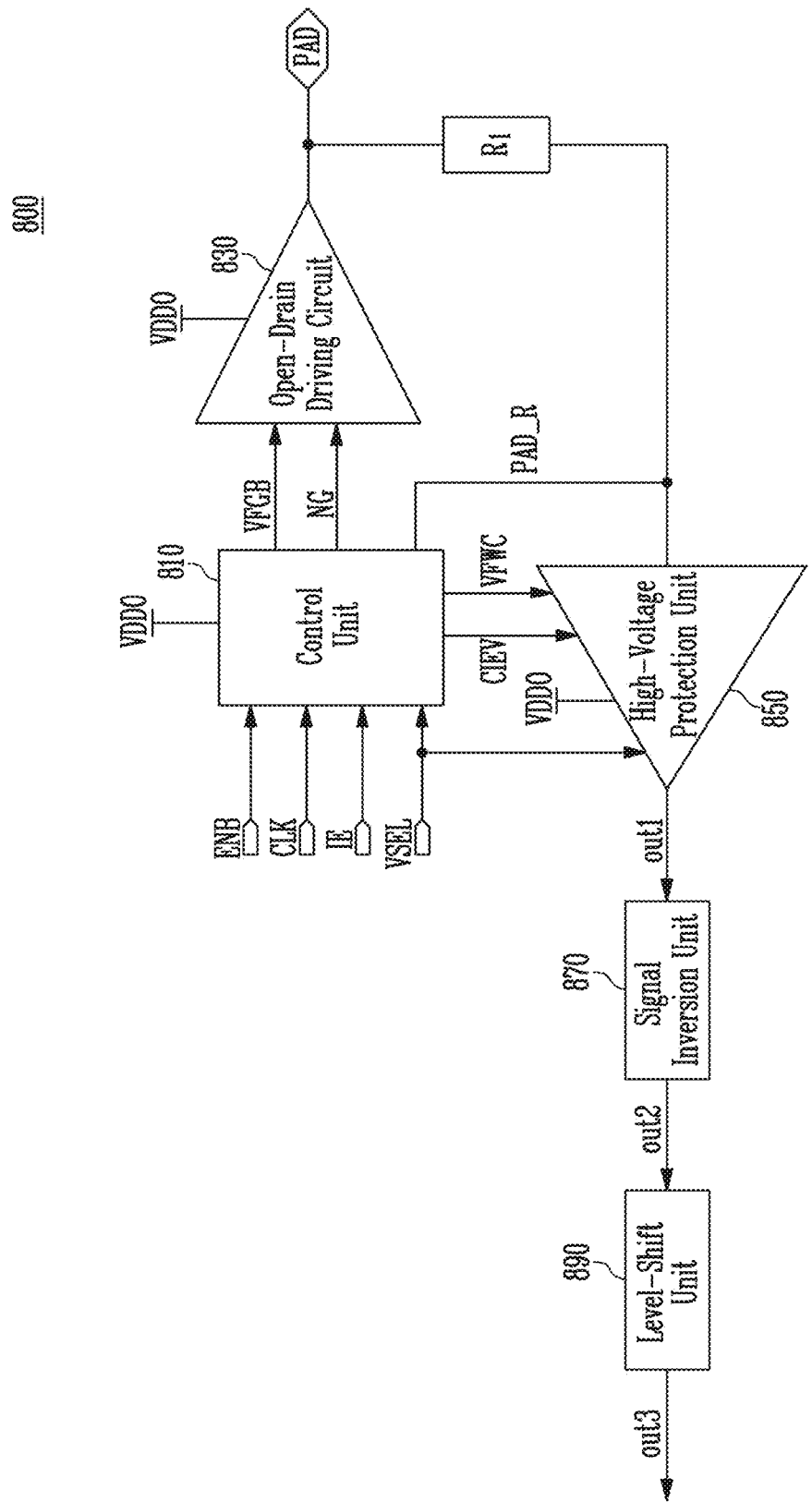
FIG. 18 is a circuit diagram illustrating an input/output driving circuit according to an embodiment of the present disclosure.

FIG. 18 is a circuit diagram illustrating an input/output driving circuit according to an embodiment of the present disclosure. Referring to FIG. 18, an input/output driving circuit 800 may include a control unit 810, an open-drain driving circuit 830, a high-voltage protection unit 850, a signal inversion unit 870, and a level-shift unit 890. The input/output driving circuit 800 may be coupled to a pad, and may further include an internal transistor $R_1$ for electrostatic discharge (ESD) protection. Through the pad, a received signal may be inputted or a signal to be transmitted may be outputted.

The control unit 810 may receive an enable signal ENB and a clock signal CLK. The enable signal ENB and the clock signal CLK may be signals for controlling an operation of driving the output of data through the pad. Meanwhile, the control unit 810 may receive an input enable signal IE and a second control signal VSEL. The input enable signal IE and the second control signal VSEL may be signals for controlling an operation of inputting data through the pad. The input enable signal IE and the second control signal VSEL that are used during the data input operation may be the input enable signal IE and the voltage select signal VSEL, which are described with reference to FIGS. 8 to 11 and FIGS. 14 to 16 of U.S. Patent Application Publication No. US 2018/0342280 A1. That is, the input enable signal IE and the second control signal VSEL illustrated in FIG. 18 may be signals substantially identical to the input enable signal IE and the voltage select signal VSEL, which are illustrated in FIGS. 8 to 11 and FIGS. 14 to 16 of U.S. Patent Application Publication No. US 2018/0342280 A1.

Also, as described above with reference to FIGS. 14 to 16, during a data output operation, the second control signal VSEL may be a signal for controlling an operation of outputting data through the pad. Meanwhile, the control unit 810 may receive a pad voltage PAD_R.

Meanwhile, the control unit 810 may be operated based on a first supply voltage VDDO. The detailed configuration of the control unit 810 will be described later with reference to FIG. 19.

The control unit 810 may output a feedback voltage VFGB and a first control signal NG. The feedback voltage VFGB and the first control signal NG may be transferred to the open-drain driving circuit 830. Since the feedback voltage VFGB and the first control signal NG have been described above with reference to FIGS. 6 to 17, repeated descriptions thereof will be omitted.

The control unit 810 may output a protection control signal CIEV and a well control signal VFWC. The protection control signal CIEV and the well control signal VFWC have been described with reference to FIGS. 7 to 16 of U.S. Patent Application Publication No. US 2018/0342280 A1. That is, the control unit 810 may generate the protection control signal CIEV for variably controlling the high-voltage protection unit 850 based on the voltage of the input signal applied to the pad and the input enable signal IE during an input operation. Also, the control unit 810 may generate the well control signal VFWC for variably controlling a well voltage of a P-type transistor included in the high-voltage protection unit 850 based on the voltage of the input signal applied to the pad. Such variable well voltage control may be performed to prevent a leakage current that may occur in the high-voltage protection unit 850.

The open-drain driving circuit 830 may be configured using sequentially coupled transistors. The open-drain driving circuit 830 may receive the feedback voltage VFGB and the first control signal NG. Further, the open-drain driving circuit 830 may be operated based on the first supply voltage VDDO. An output terminal of the open-drain driving circuit 830 may be coupled to the pad. The detailed configuration of the open-drain driving circuit 830 will be described later with reference to FIG. 20.

The high-voltage protection unit 850 may receive the protection control signal CIEV and the well control signal VFWC from the control unit 810. Also, the high-voltage protection unit 850 may receive the second control signal VSEL, and may be operated based on the first supply voltage VDDO. The second control signal VSEL received by the high-voltage protection unit 850 may be a signal substantially identical to the voltage select signal VSEL described with reference to FIGS. 8 to 11 and FIGS. 14 to 16 of U.S. Patent Application Publication No. US 2018/0342280 A1. When a high voltage is applied to the pad, the high-voltage protection unit 850 may convert the high voltage into a low voltage enabling the reliability of transistors to be guaranteed, and may transfer the low voltage to the signal inversion unit 870. That is, a first output signal out1 outputted from the high-voltage protection unit 850 may be a signal obtained by converting a high voltage received through the pad into a low voltage.

The high-voltage protection unit 850 illustrated in FIG. 18 may be a component substantially identical to the high-voltage protection unit 741' described with reference to FIGS. 7 and 12 to 16 of U.S. Patent Application Publication No. US 2018/0342280 A1. Therefore, a detailed description of the high-voltage protection unit 850 will be replaced with the description of FIGS. 7 and 12 to 16 of U.S. Patent Application Publication No. US 2018/0342280 A1.

The signal inversion unit 870 may convert the first output signal out1 received from the high-voltage protection unit 850 into a signal having a voltage swing of the first supply voltage VDDO1, and may transfer the signal to the level-shift unit 890. The detailed configuration of the signal inversion unit 870 may be substantially identical to the signal inversion unit 742 illustrated in FIG. 7 of U.S. Patent Application Publication No. US 2018/0342280 A1.

The level-shift unit 890 may convert a second output signal out2 transferred from the signal inversion unit 870 into a signal having a voltage swing of a second supply voltage VDD. In other words, the second output signal out2 may be a signal having a range from 0 V to the first supply voltage VDDO, and the level shift unit 890 may convert the second output signal out2 into a signal having a range from 0 V to the second supply voltage VDD. The second supply voltage VDD may be a voltage slightly lower than the first supply voltage VDDO. For example, when the first supply voltage VDDO is 1.8 V, the second supply voltage VDD may be set to 1.6 V. That is, when the second output signal out2 has a voltage swing of 1.8 V, a third output voltage out3 may be a signal having a voltage swing of 1.6 V. The level-shift unit 890 may be a component substantially identical to the level-shift unit 743 illustrated in FIG. 7 of U.S. Patent Application Publication No. US 2018/0342280 A1.

Figure 19:
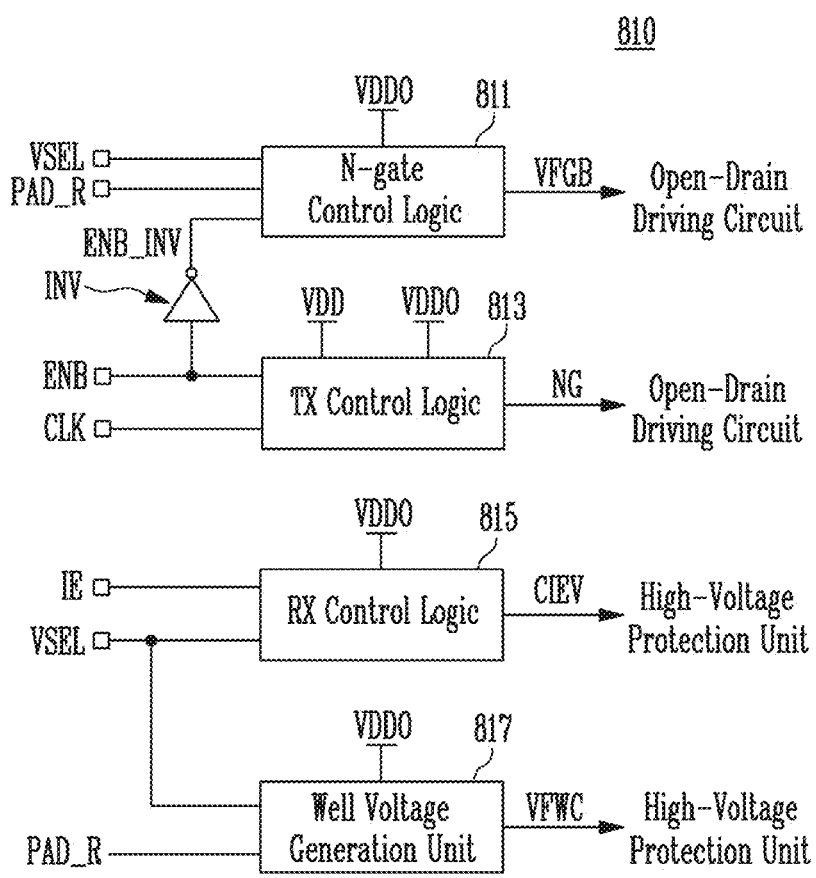
FIG. 19 is a block diagram illustrating an exemplary embodiment of the control unit 810 of FIG. 18.

FIG. 19 is a block diagram illustrating an exemplary embodiment of the control unit 810 of FIG. 18. Referring to FIG. 19, the control unit 810 may include a gate control logic 811, an inverter INV, a transmission control logic 813, a reception control logic 815, and a well voltage generation unit 817.

The gate control logic 811 may be a component substantially identical to any one of the gate control logics 450*a*, 450*b*, 550*a*, and 550*b* illustrated in FIGS. 7, 11, 15, and 16. When the gate control logic 811 is any one of the gate control logics 450*a* and 450*b* illustrated in FIGS. 7 and 11, it does not receive a second control signal VSEL. In this case, the gate control logic 811 may receive a pad voltage PAD_R and an inverted enable signal ENB_IN, and may then transfer a feedback voltage VFGB to the open-drain driving circuit 830. The inverter INV may invert an enable signal ENB and then transfer the inverted enable signal to the gate control logic 811.

When the gate control logic 811 is configured as one of the gate control logics 550*a* and 550*b* illustrated in FIGS. 15 and 16, the gate control logic 811 may receive the second control signal VSEL, the pad voltage PAD_R, and the inverted enable signal ENB_IN, and may then transfer the feedback voltage VFGB to the open-drain driving circuit 830. Repeated descriptions of the gate control logics 450*a*, 450*b*, 550*a*, and 550*b* illustrated in FIGS. 7, 11, 15, and 16 will be omitted.

The transmission control logic 813 may receive a clock signal CLK and the enable signal ENB, and may transfer a first control signal NG to the open-drain driving circuit 830. The transmission control logic 813 may be a component substantially identical to the input/output control logics 410 and 510 illustrated in FIGS. 6 and 14.

That is, the reception control logic 815 may generate a protection control signal CIEV for variably controlling the high-voltage protection unit 850 based on the voltage of an input signal applied to the pad and an input enable signal IE. The reception control logic 815 illustrated in FIG. 19 may be a component substantially identical to the control signal generation unit 745, described with reference to FIGS. 7 and 8 of U.S. Patent Application Publication No. US 2018/0342280 A1. Therefore, a detailed description of the reception control logic 815 will be replaced with the description of FIGS. 7 and 8 of U.S. Patent Application Publication No. US 2018/0342280 A1.

The well voltage generation unit 817 may generate a well control signal VFWC for variably controlling the well voltage of a P-type transistor included in the high-voltage protection unit 850 based on the voltage of the input signal applied to the pad. Such variable well voltage control may be performed to prevent a leakage current that may occur in the high-voltage protection unit 850. The well voltage generation unit 817 illustrated in FIG. 19 may be a component substantially identical to the well voltage generation unit 744, described with reference to FIGS. 7, 9, and 10 of U.S. Patent Application Publication No. US 2018/0342280 A1. Therefore, a detailed description of the well voltage generation unit 817 will be replaced with the description of FIGS. 7, 9, and 10 of U.S. Patent Application Publication No. US 2018/0342280 A1.

Figure 20:
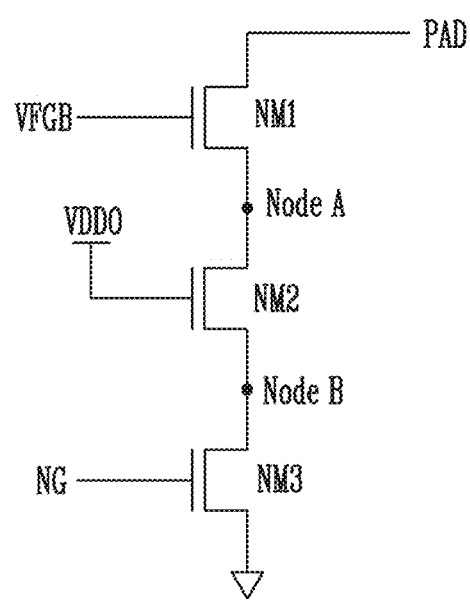
FIG. 20 is a circuit diagram illustrating an exemplary embodiment of the open-drain driving circuit 830 illustrated in FIG. 18.

FIG. 20 is a circuit diagram illustrating an exemplary embodiment of the open-drain driving circuit 830 illustrated in FIG. 18. Referring to FIG. 20, the open-drain driving circuit 830 may include first, second, and third transistors NM1, NM2, and NM3 sequentially coupled between a pad and the ground. A feedback voltage VFGB received from the gate control logic 811 may be applied to a gate terminal of the first transistor NM1. A first supply voltage VDDO may be applied to a gate terminal of the second transistor NM2. A first control signal NG received from the transmission control logic 813 may be applied to a gate terminal of the third transistor NM3. The open-drain driving circuit 830 illustrated in FIG. 20 may be composed of the first, second, and third transistors NM1, NM2, and NM3 illustrated in FIGS. 6 and 14.

Referring to FIGS. 18 to 20 together, the input/output driving circuit 810 may output a signal through the pad and receive a signal from the pad. When the input/output driving circuit 810 outputs a signal through the pad, the high-voltage protection unit 850, the signal inversion unit 870, and the level-shift unit 890 may be deactivated, and the open-drain driving circuit 830 may be activated. In this case, the input enable signal IE may be a low signal, and the enable signal ENB may be a high signal. Meanwhile, the gate control logic 811 and the transmission control logic 813 of the control unit 810 may output a signal through the pad by controlling the open-drain driving circuit 830. In this case, among the characteristics of the open-drain driving circuit, even when the clock signal CLK makes a transition from a low state to a high state, that is, when the voltage of the pad makes a transition from an external high voltage VDDH to 0 V, the difference between the voltages of the pad and the node A is maintained at 1.98 V or less, and thus the reliability of the input/output driving circuit 810 may be improved.

When the input/output driving circuit receives a signal from the pad, the open-drain driving circuit 830 may be deactivated, and the high-voltage protection unit 850, the signal inversion unit 870, and the level-shift unit 890 may be activated. In this case, the input enable signal IE may be a high signal, and the enable signal ENB may be a low signal. In particular, the reception control logic 815 and the well voltage generation unit 817 of the control unit 810 may receive a signal from the pad by controlling the high-voltage protection unit 850. When a voltage swing of the signal inputted through the pad is a high voltage HV, the high-voltage protection unit 850 may generate a first output signal out1 having a swing of the first supply voltage VDDO by converting the input signal. Therefore, as described with reference to FIGS. 12 to 16 of U.S. Patent Application Publication No. US 2018/0342280 A1, a leakage current does not occur in the signal inversion unit 870. In other words, when the first output signal out1 is a logic high signal, the first output signal out1 is set to the first supply voltage VDDO, and thus a leakage current may be prevented from occurring in the signal inversion unit 870 by completely turning off a first P-type transistor PM1 of the signal inversion unit 870.

When the voltage swing of the signal inputted through the pad is a low voltage LV, the high-voltage protection unit 850 may generate the first output signal out1 having a voltage swing, the magnitude of which is equal to that of the low voltage LV. Consequently, as described above, the first output signal out1 may completely turn off the first P-type transistor PM1 of the signal inversion unit 870, thus preventing a leakage current from occurring.

Figure 21:
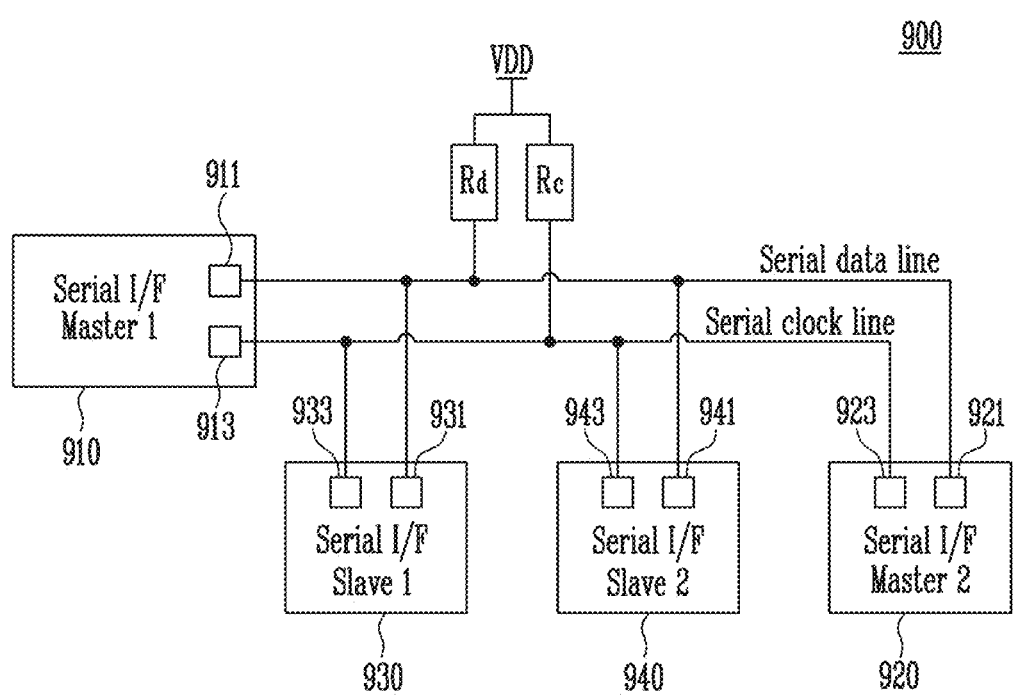
FIG. 21 is a diagram illustrating a coupling structure 900 of a plurality of serial interface devices each having an input/output driving circuit according to an embodiment of the present disclosure.

FIG. 21 is a diagram illustrating a coupling structure 900 of a plurality of serial interface devices each having an input/output driving circuit according to an embodiment of the present disclosure. Referring to FIG. 21, the coupling structure 900 may include the plurality of serial interface devices (910, 920, 930, and 940) and pull-up resistors Rd and Rc. More specifically, the coupling structure 900 includes serial I/F master devices (910 and 920) and serial I/F slave devices (930 and 940). The plurality of serial interface devices may communicate with each other through two lines, that is, a serial data (SDA) line and a serial clock (SCL) line. When communication is initiated, data may be transferred through the SDA line, and a clock signal for synchronization may be transferred through the SCL line. The SDA line and the SCL line may be coupled to each of the master devices and each of the slave devices to perform communication. However, in this case, since components to which the SDA line and the SCL line are coupled are in an open-drain state, the pull-up resistors Rd and Rc are respectively coupled to the SDA line and the SCL line, and thus the supply voltage VDD is supplied to the components. In an embodiment, the serial interface devices as shown in FIG. 21 may be connected with each other using multi-drop serial data buses such as an inter-integrated circuit (I²C), I³C or SenseWire.

An inter-integrated circuit, that is, I²C, may be a kind of serial-computer bus structure, which may be used for communication between a plurality of low-speed devices. One of the advantages of an I²C bus is to enable bidirectional communication between a master device and slave devices through two lines regardless of the number of slave devices. Another advantage of the I²C bus is to enable the use of two or more master devices.

However, since the I²C bus is based on an open-drain structure, it is impossible to perform simultaneous bidirectional communication and it is difficult to increase a communication speed. In comparison with other communication protocols, such a speed is a relatively low speed, and thus the I²C bus is used for purposes, such as the setting of communication with a low-speed peripheral device or the setting of the operation mode of the peripheral device.

In the I²C structure, each of I²C devices may be set as a master device or a slave device. A device that is the center of communication may be set as the master device, and a peripheral device desiring to communicate with the master device may be set as the slave device. Generally, when a single microcontroller unit (MCU) is coupled to a plurality of peripheral devices, a single master device may communicate with a plurality of slave devices. Also, as illustrated in FIG. 21, communication between a plurality of master devices and a plurality of slave devices is also possible. In an example of FIG. 21, a structure in which a first master device 910, a second master device 920, a first slave device 930, and a second slave device 940 are coupled to each other is illustrated.

The serial interface (I/F) devices illustrated in FIG. 21 may be coupled to the SDA line and the SCL line through respective input/output driving circuits. That is, the first serial I/F master device 910 may be coupled to the SDA line through a first input/output driving circuit 911, and may be coupled to the SCL line through a second input/output driving circuit 913. The second serial I/F master device 920 may be coupled to the SDA line through a third input/output driving circuit 921, and may be coupled to the SCL line through a fourth input/output driving circuit 923. The first serial I/F slave device 930 may be coupled to the SDA line through a fifth input/output driving circuit 931, and may be coupled to the SCL line through a sixth input/output driving circuit 933. The second serial I/F slave device 940 may be coupled to the SDA line through a seventh input/output driving circuit 941, and may be coupled to the SCL line through an eighth input/output driving circuit 943. Each of the first to eighth input/output driving circuits 911, 913, 921, 923, 931, 933, 941, and 943 may be implemented as the input/output driving circuit 800 illustrated in FIG. 18. When a signal is outputted from a serial I/F device, the open-drain driving circuit 830 of the input/output driving circuit included in the corresponding serial I/F device may be activated. Meanwhile, when an serial I/F device receives a signal, the high-voltage protection unit 850, the signal inversion unit 870, and the level-shift unit 890 of the input/output driving circuit included in the corresponding serial I/F device may be activated.

As described above, each of the serial interface devices as shown in FIG. 21 may be connected with another using an inter-integrated circuit (I²C). However, the present disclosure is not limited thereto, and the input/output driving circuit may also be applied to signal input/output of a System Management Bus (SMBus) in accordance with an embodiment. SMBus is a simple 2-wire bus that is chiefly used to communicate with low-speed devices present in a mainboard of a computing system. The SMBus may be chiefly used in a power management chip, such as a rechargeable battery subsystem of a laptop computer system, and may also be used in devices, such as a temperature sensor and a lid switch, in addition to the power management chip. In addition, according to another embodiment, each of the serial interface devices as shown in FIG. 21 may be I3C devices. I3C is designed for a mobile application processor and is an enhanced version of I²C. I3C is a standard for mobile applications and embedded systems and enables high speed communication and low power operation. Similarly to I²C, I3C uses a 2-wire bus and is compatible with I²C.

Figure 22:
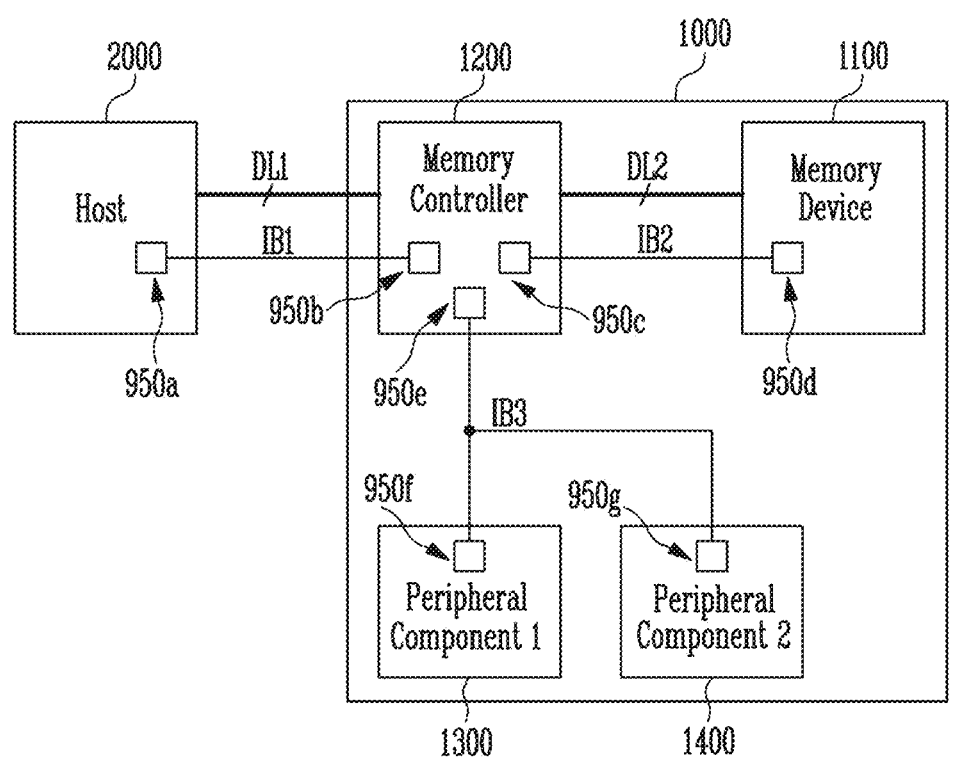
FIG. 22 is a block diagram illustrating a computing system including a serial interface device.

FIG. 22 is a block diagram illustrating a computing system including a serial interface device. Referring to FIG. 22, the computing system may include a memory system 1000 and a host 2000. The memory system 1000 may include a memory device 1100 which stores data, and a memory controller 1200 which controls the memory device 1100 under the control of the host 2000.

The host 2000 may communicate with the memory system 1000 through a first data line DL1. In detail, the host 2000 may communicate with the memory system 1000 through the first data line DL1 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), NonVolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods. In an embodiment, the host 2000 may communicate with the memory controller 1200 of the memory system 1000 through the first data line DL1.

The memory controller 1200 may control the overall operation of the memory system 1000, and may control data exchange between the host 2000 and the memory device 1100. For example, the memory controller 1200 may program or read data by controlling the memory device 1100 in response to a request received from the host 2000. Further, the memory controller 1200 may store information about main memory blocks and sub-memory blocks included in the memory device 1100, and may select the memory device 1100 so that a program operation is performed on a main memory block or a sub-memory block depending on the amount of data loaded for the program operation. In an embodiment, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR) SDRAM, a Rambus DRAM (RDRAM) or a flash memory. The memory device 1100 may perform a program operation, a read operation or an erase operation under the control of the memory controller 1200. The memory device 1100 and the memory controller 1200 may exchange data with each other through a second data line DL2.

Meanwhile, the host 2000 and the memory system 1000 may communicate with each other through a first bus IB1 separately from the first data line DL1. For this operation, the host 2000 and the memory controller 1200 may include a first serial interface device 950a and a second serial interface device 950b, respectively. Each of the first serial interface device 950a and the second serial interface device 950b may be any one of the first and second master devices 910 and 920 and the first and second slave devices 930 and 940, illustrated in FIG. 21. Therefore, the first serial interface device 950a and the second serial interface device 950b may be coupled to each other through an SDA line and an SCL line. That is, the SDL line and the SCL line coupled between the first serial interface device 950a and the second serial interface device 950b may constitute the first bus IB1. In FIG. 21, for convenience of description, the first bus IB1 is illustrated as being a single line. In this case, each of the first serial interface device 950a and the second serial interface device 950b may include an input/output driving circuit 800 according to an embodiment of the present disclosure. The first serial interface device 950a and the second serial interface device 950b may be coupled to the SDA line and the SCL line through the input/output driving circuit 800, thus outputting or receiving a signal.

User data may be transferred between the host 2000 and the memory system 1000 through the first data line DL1. Meanwhile, the additional data of the memory system 1000 may be transferred between the host 2000 and the memory system 1000 through the first bus IB1. In an embodiment, the additional data may be data about the internal temperature of the memory system 1000. In addition, various types of status information about the memory system 1000 may be transferred, as the additional data, to the host 2000 through the first bus IB1. In an example, data may be transferred from the host 2000 to the memory system 1000 through the first bus IB1.

Meanwhile, the memory controller 1200 and the memory device 1100 may communicate with each other through a second bus IB2, separately from the second data line DL2. For this operation, the memory controller 1200 and the memory device 1100 may include a third serial interface device 950c and a fourth serial interface device 950d, respectively. Each of the third serial interface device 950c and the fourth serial interface device 950d may be any one of the first and second master devices 910 and 920 and the first and second slave devices 930 and 940, illustrated in FIG. 21. Each of the first data line DL1 and the first bus IB1 may be configured as a serial interface structure. However, the first data line DL1 may operate at a higher speed than the first bus IB1. As a result, the first data line DL1 may transmit relatively large data, such as user data, at a high speed. On the other hand, the first bus IB1 may transfer relatively small additional data such as temperature data.

The user data may be transferred between the memory controller 1200 and the memory device 1100 through the second data line DL2. Meanwhile, the additional data of the memory device 1100 may be transferred between the memory controller 1200 and the memory device 1100 through the second bus IB2. In an embodiment, the additional data may be data about the internal temperature of the memory device 1100. In an example, the additional data may be data indicating the operating status of the memory device 1100, for example, the state of a read operation, a program operation or an erase operation or an idle state. In addition, various types of status information about the memory device 1100 may be transferred, as the additional data, between the memory controller 1200 and the memory device 1100 through the second bus IB2.

Also, the memory controller 1200 may communicate with a plurality of peripheral components included in the memory system 1000 through a third bus IB3. In an example of FIG. 22, the memory system 1000 is illustrated as including a first peripheral component 1300 and a second peripheral component 1400. For communication between the memory controller 1200 and the first and second peripheral components 1300 and 1400, the memory controller 1200 and the first and second peripheral components 1300 and 1400 may include a fifth serial interface device 950e, a sixth serial interface device 950f, and a seventh serial interface device 950g, respectively. Each of the fifth serial interface device 950e, the sixth serial interface device 950f, and the seventh serial interface device 950g may be any one of the first and second master devices 910 and 920 and the first and second slave devices 930 and 940, illustrated in FIG. 21.

Data may be transferred between the memory controller 1200 and the peripheral components 1300 and 1400 through the third bus IB3. In an embodiment, the first peripheral component 1300 may be a temperature sensor, wherein the data transferred from the first peripheral component 1300 to the memory controller 1200 through the third bus IB3 may be sensed temperature information. In an embodiment, the memory controller 1200 may also transfer data required so as to set the operation mode of the peripheral components 1300 and 1400 to the peripheral components 1300 and 1400 through the third bus IB3.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An interface system including a plurality of interface devices communicating each other, each of the interface devices comprising:
at least one input/output driving circuit including a pull-down driver connected between a pad and a ground node, and a gate control logic connected between a pad voltage terminal and a first supply voltage terminal,
wherein the pull-down driver includes a first NMOS transistor connected to the pad, a second NMOS transistor connected to the first NMOS transistor, and a third NMOS transistor connected between the second NMOS transistor and the ground node,
wherein the gate control logic includes a first PMOS transistor connected to the pad voltage terminal and controlled by a first supply voltage provided from the first supply voltage terminal, a second PMOS transistor connected to the first PMOS transistor, and a third PMOS transistor connected between the second PMOS transistor and the first supply voltage terminal, and
wherein the second PMOS transistor is enabled based on a pad voltage provided from the pad voltage terminal, and the first NMOS transistor is enabled based on a feedback voltage provided to bulk regions of the first to third PMOS transistors.

2. The interface system of claim 1, wherein the input/output driving circuit further comprises an internal resistor connected to the pad receiving an external voltage higher than the first supply voltage, and
wherein the pad voltage terminal is an output node of the internal resistor.

3. The interface system of claim 1, wherein the input/output driving circuit further comprises an IO (input and output) control logic configured to receive a clock signal and an enable signal, as input signals, and generate a first control signal provided to a gate of the third NMOS transistor.

4. The interface system of claim 3, wherein the IO control logic receives the first supply voltage and a second supply voltage lower than the first supply voltage, as a power source.

5. The interface system of claim 3, wherein the third PMOS transistor receives an inverted enable signal, as a gate voltage.

6. The interface system of claim 3, wherein the first to third NMOS transistors and the first to third PMOS transistors are designed to be driven under a second supply voltage lower than the first supply voltage.

7. The interface system of claim 6, wherein at least one of the gate control logic and the IO control logic provides at least one control signal to gates of the first and third NMOS transistors to maintain internal voltages of the first to third NMOS transistors in a voltage range of the second supply voltage, when the first supply voltage or a voltage higher than the first supply voltage is input to at least one of electrodes of the first to third NMOS transistors,
wherein the internal voltages include gate-source voltages, gate-drain voltages and drain-source voltages of the first to third NMOS transistors.

8. The interface system of claim 7, wherein the second NMOS transistor receives the first supply voltage, as a gate voltage.

9. The interface system of claim 1, wherein the gate control logic further comprises at least one of a voltage stabilizing unit and an external voltage selection unit,
wherein the voltage stabilizing unit is electrically connected between the pad voltage terminal and the bulk regions of the first to third PMOS transistors where the feedback voltage is outputted, based on the first supply voltage, and
wherein the external voltage selection unit is electrically connected between the bulk regions of the first to third PMOS transistors and the first power supply voltage terminal, based on the first supply voltage and a second control signal.

10. An interface system between a memory device and a memory controller, comprising:
at least one input/output driving circuit including:
a pull-down driver including a first transistor and a second transistor which are electrically coupled between a pad and a ground node; and
a gate control logic including a third transistor and a fourth transistor which are electrically coupled between the pad and a first supply voltage terminal, the gate control logic configured to receive a pad voltage provided from the pad and generate a feedback voltage,
wherein a source voltage level of the second transistor is controlled by a control signal generated based on a clock signal and an enable signal.

11. The interface system of claim 10, wherein the input/output driving circuit further comprises an IO control logic configured to receive the clock signal and the enable signal, as input signals, and generate the control signal.

12. The interface system of claim 11, wherein the first to fourth transistors are designed to be driven under a second supply voltage lower than a first supply voltage provided from the first supply voltage terminal.

13. The interface system of claim 12, wherein at least one of the gate control logic and the IO control logic provides at least one control signal to gates of the first and second transistors to maintain internal voltages of the first to fourth transistors in a voltage range of the second supply voltage, when the first supply voltage or a voltage higher than the first supply voltage is input to at least one of electrodes of the first and second transistors, and
wherein the internal voltages include gate-source voltages, gate-drain voltages and drain-source voltages of the first to fourth transistors.

14. A memory system comprising:
a memory device configured to store data; and
a memory controller configured to communicate with the memory device by an input/output driving circuit,
wherein the input/output driving circuit comprises:
a pull-down driver including a first transistor and a second transistor which are electrically coupled between a pad and a ground node; and
a gate control logic including a third transistor and a fourth transistor which are electrically coupled between the pad and a first terminal receiving a first driving voltage, the gate control logic being configured to receive a pad voltage provided from the pad and generate a feedback voltage,
wherein a source voltage level of the second transistor is controlled by a control signal generated based on a clock signal and an enable signal.

15. The memory system of claim 14, wherein the input/output driving circuit further comprises an IO control logic configured to receive the clock signal and the enable signal as input signals, and generate the control signal.

16. The memory system of claim 15, wherein the first to fourth transistors are designed to be driven under a second driving voltage lower than the first driving voltage.

17. The memory system of claim 16, wherein at least one of the gate control logic and the IO control logic provides at least one control signal to gates of the first and second transistors to maintain internal voltages of the first to fourth transistors in a voltage range of the second driving voltage, when the first driving voltage or a voltage higher than the first driving voltage is input to at least one of electrodes of the first and second transistors, and wherein the internal voltages include gate-source voltages, gate-drain voltages and drain-source voltages of the first to fourth transistors.

\* \* \* \* \*